(12) United States Patent
Huang et al.

(10) Patent No.: US 11,782,304 B2
(45) Date of Patent: Oct. 10, 2023

(54) DISPLAY PANEL, DISPLAY APPARATUS, METHOD OF FABRICATING DISPLAY PANEL, AND COUNTER SUBSTRATE

(71) Applicant: BOE Technology Group Co., Ltd., Beijing (CN)

(72) Inventors: Haitao Huang, Beijing (CN); Shi Shu, Beijing (CN); Chuanxiang Xu, Beijing (CN); Liuqing Li, Beijing (CN); Zhao Cui, Beijing (CN); Renquan Gu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 240 days.

(21) Appl. No.: 17/419,685

(22) PCT Filed: Sep. 29, 2020

(86) PCT No.: PCT/CN2020/118719
§ 371 (c)(1),
(2) Date: Jun. 29, 2021

(87) PCT Pub. No.: WO2022/067472
PCT Pub. Date: Apr. 7, 2022

(65) Prior Publication Data
US 2022/0317513 A1 Oct. 6, 2022

(51) Int. Cl.
*G02F 1/1335* (2006.01)
*G02F 1/1343* (2006.01)
(Continued)

(52) U.S. Cl.
CPC ........ *G02F 1/133519* (2021.01); *C23C 16/26* (2013.01); *C23C 16/50* (2013.01);
(Continued)

(58) Field of Classification Search
CPC . G02F 2/02; G02F 2001/01791; H01L 33/50; H01L 33/507; H01L 27/322; H10K 59/38; H05B 33/145; C01P 2004/64
See application file for complete search history.

(56) References Cited

U.S. PATENT DOCUMENTS

2001/0019884 A1* 9/2001 Miller ............... H01L 21/76871
257/762
2012/0274882 A1* 11/2012 Jung ...................... B82Y 20/00
349/96
(Continued)

FOREIGN PATENT DOCUMENTS

CN 101355097 A 1/2009
CN 103021574 A 4/2013
(Continued)

OTHER PUBLICATIONS

International Search Report & Written Opinion dated Jun. 24, 2021, regarding PCT/CN2020/118719.

*Primary Examiner* — Jonathan Y Jung
(74) *Attorney, Agent, or Firm* — Intellectual Valley Law, P.C.

(57) ABSTRACT

A display panel is provided. The display panel includes a bank layer and a quantum dots material layer on a base substrate. The bank layer defines a plurality of bank apertures. The quantum dots material layer includes a plurality of quantum dots blocks respectively in at least some of the plurality of bank apertures. At least a portion of the bank layer between two adjacent bank apertures includes a first surface, a second surface opposite to the first surface, a third surface connecting the first surface and the second surface closer to a first bank aperture, and a fourth surface connecting the first surface and the second surface closer to a second bank aperture. At least a portion of a third surface or a fourth surface of a portion of the bank layer between two adjacent (Continued)

bank apertures is a wavy surface including alternating convex and concave portions.

10 Claims, 16 Drawing Sheets

(51) Int. Cl.
| | | |
|---|---|---|
| *G02F 1/1368* | (2006.01) | |
| *G03F 7/00* | (2006.01) | |
| *H10K 59/122* | (2023.01) | |
| *G02F 1/1333* | (2006.01) | |
| *H10K 59/12* | (2023.01) | |
| *C23C 16/26* | (2006.01) | |
| *C23C 16/50* | (2006.01) | |
| *H10K 71/00* | (2023.01) | |
| *H10K 102/00* | (2023.01) | |

(52) U.S. Cl.
CPC ...... *G02F 1/1368* (2013.01); *G02F 1/133514* (2013.01); *G02F 1/133548* (2021.01); *G02F 1/134345* (2021.01); *G03F 7/0007* (2013.01); *H10K 59/122* (2023.02); *H10K 71/00* (2023.02); *G02F 1/133357* (2021.01); *G02F 2202/36* (2013.01); *H10K 59/1201* (2023.02); *H10K 2102/331* (2023.02)

(56) References Cited

U.S. PATENT DOCUMENTS

| | | |
|---|---|---|
| 2017/0096600 A1 | 4/2017 | Tour et al. |
| 2018/0102449 A1 | 4/2018 | Pschenitzka et al. |
| 2018/0157077 A1 | 6/2018 | Kwon et al. |
| 2018/0211979 A1* | 7/2018 | Lee ............... H01L 27/1218 |
| 2019/0051712 A1 | 2/2019 | Yu et al. |
| 2019/0067624 A1 | 2/2019 | Choi et al. |
| 2019/0094624 A1* | 3/2019 | Kim ............... G02F 1/133617 |
| 2020/0141027 A1* | 5/2020 | Fimland ........... H01L 21/02455 |
| 2020/0243622 A1* | 7/2020 | Chung ............. H10K 50/854 |
| 2021/0217777 A1* | 7/2021 | Chung ............. H01L 27/1255 |
| 2021/0336171 A1 | 10/2021 | Peng |
| 2022/0037411 A1* | 2/2022 | Zhang ............. H10K 50/865 |

FOREIGN PATENT DOCUMENTS

| | | |
|---|---|---|
| CN | 105425463 A | 3/2016 |
| CN | 106536404 A | 3/2017 |
| CN | 106783918 A | 5/2017 |
| CN | 107452782 A | 12/2017 |
| CN | 108153039 A | 6/2018 |
| CN | 108346681 A | 7/2018 |
| CN | 109103349 A | 12/2018 |
| CN | 109427858 A | 3/2019 |
| CN | 109742133 A | 5/2019 |
| CN | 109803925 A | 5/2019 |
| CN | 109962176 A | 7/2019 |
| CN | 110797378 A | 2/2020 |
| CN | 111599801 A | 8/2020 |
| JP | 2020047852 A | 3/2020 |

\* cited by examiner

DISPLAY PANEL, DISPLAY APPARATUS, METHOD OF FABRICATING DISPLAY PANEL, AND COUNTER SUBSTRATE

CROSS-REFERENCE TO RELATED APPLICATION

This application is a national stage application under 35 U.S.C. § 371 of International Application No. PCT/CN2020/118719, filed Sep. 29, 2020, the contents of which are incorporated by reference in the entirety.

TECHNICAL FIELD

The present invention relates to display technology, more particularly, to a display panel, a display apparatus, a method of fabricating a display panel, and a counter substrate.

BACKGROUND

Quantum dots have unique photoluminescence and electroluminescence properties due to quantum size effects and dielectric confinement effects. Quantum dots have excellent optical properties such as high quantum yield, high photochemical stability, anti-photolysis, broad-band excitation, narrow-band emission, high color purity, and a tunable color of emitted light through quantum dot size control. Various advantages such as high luminous efficiency, good stability, long service life, high brightness and broad color gamut can be obtained in a display panel utilizing quantum dots materials.

SUMMARY

In one aspect, the present disclosure provides a display panel, comprising a base substrate; a bank layer on the base substrate, the bank layer defining a plurality of bank apertures; and a quantum dots material layer on the base substrate, the quantum dots material layer comprising a plurality of quantum dots blocks respectively in at least some of the plurality of bank apertures; wherein at least a portion of the bank layer between two adjacent bank apertures comprises a first surface, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures; at least a portion of the third surface is a wavy surface comprising alternating convex and concave portions; at least a portion of the fourth surface is a wavy surface comprising alternating convex and concave portions; in a respective one of the plurality of bank apertures having a respective one of the plurality of quantum dots blocks, an orthographic projection of the alternating convex and concave portions of the third surface on a vertical plane at least partially overlaps with an orthographic projection of the respective one of the plurality of quantum dots blocks on the vertical plane, and an orthographic projection of the alternating convex and concave portions of the fourth surface on the vertical plane at least partially overlaps with an orthographic projection of the respective one of the plurality of quantum dots blocks on the vertical plane; and the vertical plane is a plane perpendicular to the base substrate and perpendicular to a direction from the first bank aperture to the second bank aperture.

Optionally, the display panel further comprises a barrier coating layer in a respective one of the plurality of bank apertures; and wherein the barrier coating layer is in direct contact with the at least a portion of the third surface and in direct contact with the at least a portion of the fourth surface.

Optionally, the barrier coating layer is in direct contact with the respective one of the plurality of quantum dots blocks.

Optionally, the barrier coating layer comprises a graphene material.

Optionally, the barrier coating layer comprises surface functionalized graphene.

Optionally, the surface functionalized graphene is a plasma functionalized graphene comprising one or more of surface functional groups, which bind, through interactions comprising hydrogen bonds, to functional groups in quantum dots materials in the respective one of the plurality of quantum dots blocks.

Optionally, a portion of the barrier coating layer in direct contact with the at least a portion of the third surface has a wavy surface comprising alternating convex and concave portions; and a portion of the barrier coating layer in direct contact with the at least a portion of the fourth surface has a wavy surface comprising alternating convex and concave portions.

Optionally, the display panel further comprises a color filter layer on a side of the quantum dots material layer away from the base substrate; wherein the color filter layer comprises a plurality of color filter blocks respectively on a side of the plurality of bank apertures away from the base substrate.

Optionally, the display panel further comprises a plurality of thin film transistors on the base substrate; a planarization layer on a side of the plurality of thin film transistors away from the base substrate; an anode layer comprising a plurality of anodes on a side of the planarization layer away from the base substrate; a pixel definition layer on a side of the planarization layer and the anode layer away from the base substrate, the pixel definition layer defining a plurality of subpixel apertures; a light emitting material layer on a side of the anode layer away from the base substrate, the light emitting material layer comprising a plurality of light emitting blocks respectively in the plurality of subpixel apertures; a cathode layer on a side of the light emitting material layer away from the base substrate; an encapsulating layer on a side of the cathode layer away from the base substrate; wherein the bank layer and the pixel definition layer are in an inter-subpixel region of the display panel; and an orthographic projection of the bank layer on the base substrate at least partially overlaps with an orthographic projection of the pixel definition layer on the base substrate.

Optionally, the first surface is in direct contact with the encapsulating layer; and in the respective one of the plurality of bank apertures, the respective one of the quantum dots blocks is on a side of a portion of the encapsulating layer away from the cathode layer; wherein the display panel further comprises a barrier coating layer in a respective one of the plurality of bank apertures; and at least a portion of the barrier coating layer is in direct contact with the portion of the encapsulating layer.

Optionally, the display panel further comprises a second base substrate opposite to the base substrate; wherein the bank layer and the quantum dots material layer are between the second base substrate and the encapsulating layer; the display panel further comprises a second encapsulating layer on a side of the bank layer and the quantum dots material layer away from the second base substrate, encapsulating the bank layer and the quantum dots material layer; and a filler layer between the encapsulating layer and the second encapsulating layer.

Optionally, the display panel is a liquid crystal display panel comprising an array substrate, a counter substrate, a liquid crystal layer between the array substrate and the counter substrate, and a back light; wherein the counter substrate comprises a second base substrate; wherein the bank layer and the quantum dots material layer are on the second base substrate; wherein the counter substrate further comprises a barrier coating layer in a respective one of the plurality of bank apertures; and an overcoat layer on a side of the quantum dots material layer, the bank layer, and the barrier coating layer away from the second base substrate; wherein the barrier coating layer is in direct contact with a respective one of the plurality of quantum dots blocks.

Optionally, the counter substrate further comprises a wire grid polarizer on a side of the overcoat layer away from the second base substrate.

In another aspect, the present disclosure provides a display apparatus, comprising the display panel described herein or fabricated by a method described herein, and an integrated circuit connected to the display panel.

In another aspect, the present disclosure provides a method of fabricating a display panel, comprising forming a bank layer on a base substrate, the bank layer formed to define a plurality of bank apertures; and forming a quantum dots material layer on the base substrate, forming the quantum dots material layer comprising forming a plurality of quantum dots blocks respectively in at least some of the plurality of bank apertures; wherein the bank layer is formed so that at least a portion of the bank layer between two adjacent bank apertures comprises a first surface, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures; at least a portion of the third surface is a wavy surface comprising alternating convex and concave portions; at least a portion of the fourth surface is a wavy surface comprising alternating convex and concave portions; in a respective one of the plurality of bank apertures having a respective one of the plurality of quantum dots blocks, an orthographic projection of the alternating convex and concave portions of the third surface on a vertical plane at least partially overlaps with an orthographic projection of the respective one of the plurality of quantum dots blocks on the vertical plane, and an orthographic projection of the alternating convex and concave portions of the fourth surface on the vertical plane at least partially overlaps with an orthographic projection of the respective one of the plurality of quantum dots blocks on the vertical plane; and the vertical plane is a plane perpendicular to the base substrate and perpendicular to a direction from the first bank aperture to the second bank aperture.

Optionally, forming the bank layer comprises forming a photoresist layer on the base substrate; exposing the photoresist layer with a light under a condition to induce standing wave effect on exposing the photoresist layer; and developing an exposed photoresist layer to form the bank layer having wavy surfaces as a result of the standing wave effect.

Optionally, the method further comprises forming a barrier coating layer in a respective one of the plurality of bank apertures; wherein the barrier coating layer is formed to be in direct contact with the at least a portion of the third surface and in direct contact with the at least a portion of the fourth surface; forming the quantum dots material layer comprises ink-jet printing a quantum dots material solution into the respective one of the plurality of bank apertures, and drying the quantum dots material solution; and a respective one of the plurality of quantum dots blocks is formed to be in direct contact with the barrier coating layer.

Optionally, an entire process of forming the barrier coating layer is performed at a temperature less than 100 degrees; and an entire process of forming the bank layer is performed at a temperature less than 100 degrees.

Optionally, forming the barrier coating layer comprises depositing a graphene material layer in the respective one of the plurality of bank apertures; and performing a surface plasma treatment on the graphene material layer to form surface functionalized graphene on a surface of the graphene material layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel, a display apparatus, a method of fabricating a display panel, and a counter substrate that substantially obviate one or more of the problems due to limitations and disadvantages of the related art. In one aspect, the present disclosure provides a display panel. In some embodiments, the display panel includes a base substrate; a bank layer on the base substrate, the bank layer defining a plurality of bank apertures; and a quantum dots material layer on the base substrate, the quantum dots material layer comprising a plurality of quantum dots blocks respectively in at least some of the plurality of bank apertures. Optionally, at least a portion of the bank layer between two adjacent bank apertures comprises a first surface, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures. Optionally, at least a portion of the third surface is a wavy surface comprising alternating convex and concave portions. Optionally, at least a portion of the fourth surface is a wavy surface comprising alternating convex and concave portions.

Figure 1A:
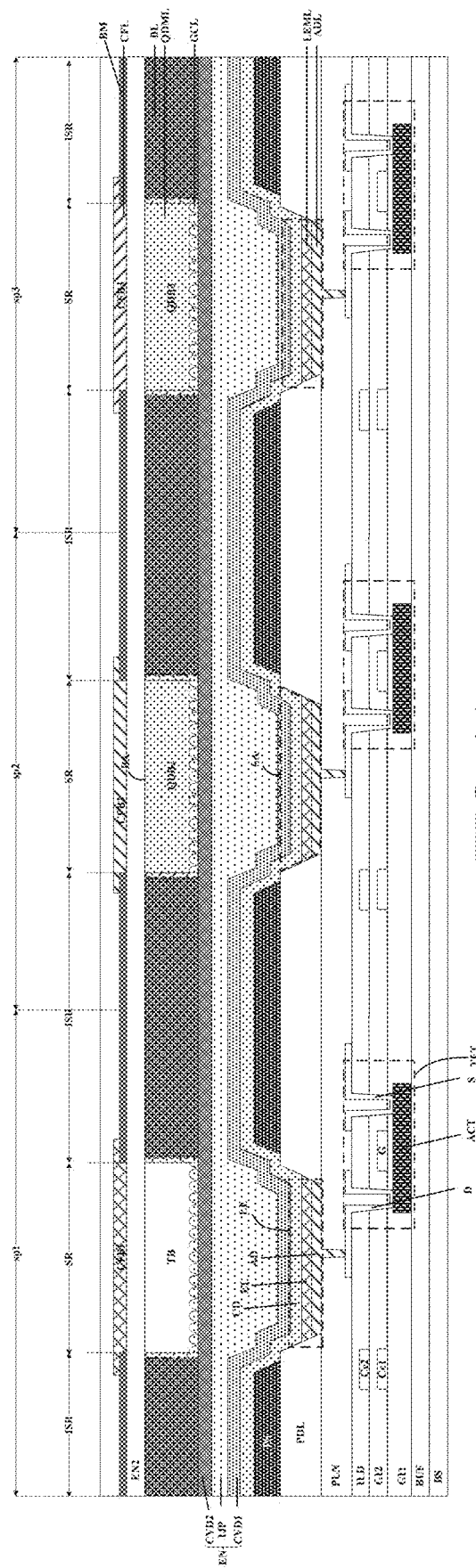
FIG. 1A is a schematic diagram illustrating the structure of a display panel in some embodiments according to the present disclosure.
Figure 2:
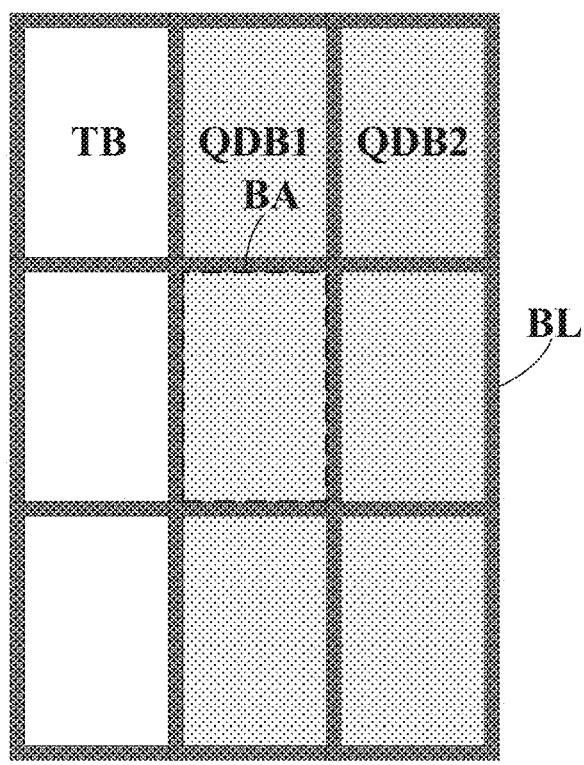
FIG. 2 is a plan view of a bank layer and a quantum dots layer in a display panel in some embodiments according to the present disclosure.

FIG. 1A is a schematic diagram illustrating the structure of a display panel in some embodiments according to the present disclosure. FIG. 2 is a plan view of a bank layer and a quantum dots layer in a display panel in some embodiments according to the present disclosure. Referring to FIG. 1A and FIG. 2, the display panel in some embodiments includes a base substrate BS; a plurality of thin film transistors TFT on the base substrate BS; a planarization layer PLN on a side of the plurality of thin film transistors TFT away from the base substrate BS; an anode layer ADL including a plurality of anodes AD on a side of the planarization layer PLN away from the base substrate BS; a pixel definition layer PDL on a side of the planarization layer PLN and the anode layer ADL away from the base substrate BS, the pixel definition layer defining a plurality of subpixel apertures SA; a light emitting material layer LEML on a side of the anode layer ADL away from the base substrate BS, the light emitting material layer LEML including a plurality of light emitting blocks EL respectively in the plurality of subpixel apertures SA; a cathode layer CD on a side of the light emitting material layer away from the base substrate; an encapsulating layer EN on a side of the cathode layer CD away from the base substrate BS; a bank layer BL on a side of the encapsulating layer EN away from the base substrate BS, the bank layer BL defining a plurality of bank apertures BA; and a quantum dots material layer QDML on a side of the encapsulating layer EN away from the base substrate BS, the quantum dots material layer QDML including a plurality of quantum dots blocks (e.g., QDB2 and QDB3) respectively in at least some of the plurality of bank apertures BA.

Various appropriate light emitting material may be used in the present display panel. Examples of appropriate light emitting material include an organic light emitting material, a quantum dots light emitting material, a micro light emitting material, and an electroluminescence material. Accordingly, various appropriate light emitting elements may be used in the present display panel. Examples of appropriate light emitting elements include an organic light emitting diode, a quantum dots light emitting diode, a micro light emitting diode, and an electroluminescence diode.

In one example, and referring to FIG. 1A, the display panel includes a base substrate BS (e.g., a flexible base substrate); a buffer layer BUF on the base substrate BS; an active layer ACT of a respective one of a plurality of thin film transistors TFT on a side of the buffer layer BUF away from the base substrate BS; a first gate insulating layer GI1 on a side of the active layer ACT away from the base substrate BS; a gate electrode G and a first capacitor electrode Ce1 on a side of the first gate insulating layer GI1 away from the buffer layer BUF; a second gate insulating layer GI2 on a side of the gate electrode G and the first capacitor electrode Ce1 away from the first gate insulating layer GI1; a second capacitor electrode Ce2 on a side of the second gate insulating layer GI2 away from the first gate insulating layer GI1; an inter-layer dielectric layer ILD on a side of the second capacitor electrode Ce2 away from the second gate insulating layer GI2; a source electrode S and a drain electrode D on a side of the inter-layer dielectric layer ILD away from the second gate insulating layer GI2; a planarization layer PLN on a side of the source electrode S and the drain electrode D away from the inter-layer dielectric layer ILD; a pixel definition layer PDL defining a subpixel aperture SA and on a side of the planarization layer PLN away from the base substrate BS; a spacer layer PS on a side of the pixel definition layer PDL away from the base substrate BS; and a light emitting element LE in the subpixel aperture SA. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer IP on a side of the first inorganic encapsulating sub-layer CVD1 away from the base substrate BS, and a second inorganic encapsulating sub-layer CVD2 on a side of the organic encapsulating sub-layer IP away from the first inorganic encapsulating sub-layer CVD1.

In some embodiments, the display panel includes a plurality of subpixels. In one example, and referring to FIG. 1A, the display panel includes a plurality of subpixels of first color sp1 (e.g., blue subpixels), a plurality of subpixels of second color sp2 (e.g., red subpixels), and a plurality of subpixels of third color sp3 (e.g., green subpixels). In another example, the plurality of light emitting blocks EL in the plurality of subpixels of first color sp1, the plurality of subpixels of second color sp2, and a plurality of subpixels of third color sp3, are of a same color. For example, the plurality of light emitting blocks EL in the plurality of subpixels of first color sp1, the plurality of subpixels of second color sp2, and a plurality of subpixels of third color sp3, are all blue light emitting blocks.

Referring to FIG. 1A, in some embodiments, the bank layer BL and the pixel definition layer PDL are in an inter-subpixel region ISR of the display panel. Optionally, the spacer layer PS is also in the inter-subpixel region ISR of the display panel. Optionally, the plurality of light emitting blocks EL are in a subpixel region SR of the display panel. Optionally, an orthographic projection of the bank layer BL on the base substrate BS at least partially overlaps with an orthographic projection of the pixel definition layer PDL on the base substrate BS.

As used herein, an inter-subpixel region refers to a region between adjacent subpixel regions, such as a region corresponding to a black matrix in a liquid crystal display, a region corresponding a pixel definition layer in an organic light emitting diode display panel, or a bank layer in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

As used herein, a subpixel region refers to a light emission region of a subpixel, such as a region corresponding to a pixel electrode in a liquid crystal display, a region corresponding to a light emissive layer in an organic light emitting diode display panel, or a region corresponding to the light transmission blocks in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel.

In some embodiments, the quantum dots material layer QDML includes a plurality of quantum dots blocks respectively in at least some of the plurality of bank apertures BA. In one example, the quantum dots material layer QDML includes a plurality of quantum dots blocks of a second color QDB2 respectively in bank apertures respectively in the plurality of subpixels of second color sp2, and a plurality of quantum dots blocks of a third color QDB3 respectively in bank apertures respectively in the plurality of subpixels of third color sp3.

Optionally, the quantum dots material layer QDML further includes a plurality of quantum dots blocks of a first color respectively in bank apertures respectively in the plurality of subpixels of first color sp1.

Optionally, the quantum dots material layer QDML is absent in the bank apertures respectively in the plurality of subpixels of first color sp1. In one example, in the bank apertures respectively in the plurality of subpixels of first color sp1, the display panel includes a plurality of transparent blocks TB, as shown in FIG. 1A and FIG. 2. In another example, in the bank apertures respectively in the plurality of subpixels of first color sp1, the display panel includes color filter blocks of the first color.

In some embodiments, the display panel further includes a color filter layer CFL on a side of the quantum dots material layer QDML away from the encapsulating layer EN. In some embodiments, the color filter layer CFL includes a plurality of color filter blocks respectively on a side of the plurality of bank apertures BA away from the encapsulating layer EN. In one example, the color filter layer CFL includes a plurality of color filter blocks of a first color CFB1 (e.g., blue color filter blocks) in the plurality of subpixels of the first color (e.g., blue subpixels), a plurality of color filter blocks of a second color CFB1 (e.g., red color filter blocks) in the plurality of subpixels of the second color (e.g., red subpixels), and a plurality of color filter blocks of a third color CFB1 (e.g., green color filter blocks) in the plurality of subpixels of the third color (e.g., green subpixels).

In some embodiments, the display panel further includes a black matrix BM on a side of the bank layer BL away from the encapsulating layer EN. Optionally, the black matrix BM is in the inter-subpixel region ISR of the display panel. Orthographic projections of the bank layer BL and the black matrix BM on the base substrate BS at least partially overlap with each other. Optionally, an orthographic projection of the bank layer BL on the base substrate BS covers an orthographic projection of the black matrix BM on the base substrate BS.

In some embodiments, the display panel further includes a second encapsulating layer EN2 encapsulating the quantum dots material layer QDML including the plurality of quantum dots blocks (e.g., QDB2 and QDB3). Optionally, the second encapsulating layer EN2 further encapsulates the plurality of transparent blocks TB.

Figure 1B:
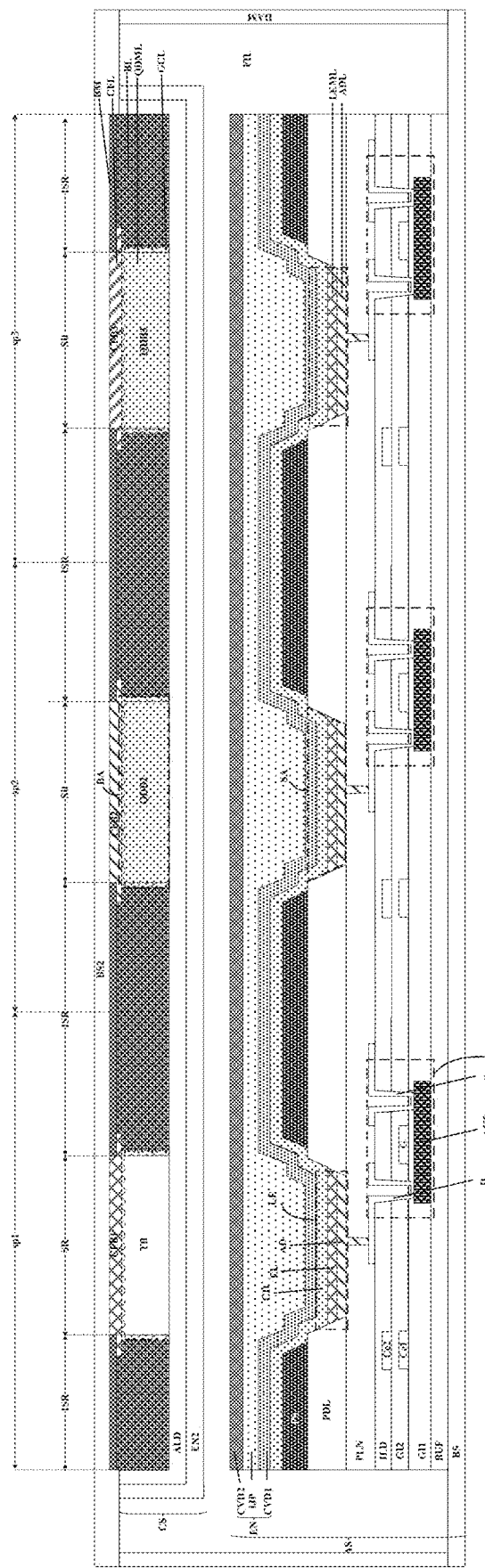
FIG. 1B is a schematic diagram illustrating the structure of a display panel in some embodiments according to the present disclosure.

FIG. 1B is a schematic diagram illustrating the structure of a display panel in some embodiments according to the present disclosure. FIG. 1B depicts a display panel comprising an array substrate AS and a counter substrate CS assembled together using a wall layer DAM disposed in a peripheral region of the display panel and connecting the array substrate AS and the counter substrate CS together. The display panel further includes a filler layer FIL filling in the space between the array substrate AS and the counter substrate CS and encircled by the wall layer DAM. In some embodiments, the array substrate AS includes a base substrate BS (e.g., a flexible base substrate); a buffer layer BUF on the base substrate BS; an active layer ACT of a respective one of a plurality of thin film transistors TFT on a side of the buffer layer BUF away from the base substrate BS; a first gate insulating layer GI1 on a side of the active layer ACT away from the base substrate BS; a gate electrode G and a first capacitor electrode Ce1 on a side of the first gate insulating layer GI1 away from the buffer layer BUF; a second gate insulating layer GI2 on a side of the gate electrode G and the first capacitor electrode Ce1 away from the first gate insulating layer GI1; a second capacitor electrode Ce2 on a side of the second gate insulating layer GI2 away from the first gate insulating layer GI1; an inter-layer dielectric layer ILD on a side of the second capacitor electrode Ce2 away from the second gate insulating layer GI2; a source electrode S and a drain electrode D on a side of the inter-layer dielectric layer ILD away from the second gate insulating layer GI2; a planarization layer PLN on a side of the source electrode S and the drain electrode D away from the inter-layer dielectric layer ILD; a pixel definition layer PDL defining a subpixel aperture SA and on a side of the planarization layer PLN away from the base substrate BS; a spacer layer PS on a side of the pixel definition layer PDL away from the base substrate BS; and a light emitting element LE in the subpixel aperture SA. The light emitting element LE includes an anode AD on a side of the planarization layer PLN away from the inter-layer dielectric layer ILD; a light emitting layer EL on a side of the anode AD away from the planarization layer PLN; and a cathode layer CD on a side of the light emitting layer EL away from the anode AD. The display panel in the display region further includes an encapsulating layer EN encapsulating the light emitting element LE, and on a side of the cathode layer CD away from the base substrate BS. The encapsulating layer EN in some embodiments includes a first inorganic encapsulating sub-layer CVD1 on a side of the cathode layer CD away from the base substrate BS, an organic encapsulating sub-layer UP on a side of the first inorganic encapsulating sub-layer CVD1 away from the base substrate BS, and a second inorganic encapsulating sub-layer CVD2 on a side of the organic encapsulating sub-layer IP away from the first inorganic encapsulating sub-layer CVD.

In some embodiments, the counter substrate CS includes a second base substrate BS2, a color filter layer CFL and a black matrix BM on the second base substrate BS, a bank layer BL on a side of the black matrix BM away from the second base substrate BS2, the bank layer BL defining a plurality of bank apertures BA; a barrier coating layer GCL in a respective one of the plurality of bank apertures BA; a quantum dots material layer QDML on a side of the color filter layer CFL away from the second base substrate BS2, the quantum dots material layer QDML including a plurality of quantum dots blocks (e.g., QDB2 or QDB3) respectively in at least some of the plurality of bank apertures BA; and a second encapsulating layer EN2 on a side of the quantum dots material layer QDML away from the second base substrate BS2, the second encapsulating layer EN2 encapsulating the quantum dots material layer QDML including the plurality of quantum dots blocks (e.g., QDB2 and QDB3). Optionally, the second encapsulating layer EN2 further encapsulates the plurality of transparent blocks TB.

Optionally, the second encapsulating layer EN2 includes a single layer structure. In one example, the single layer structure includes a silicon nitride material.

Optionally, the second encapsulating layer EN2 includes a first inorganic encapsulating sub-layer, an organic encapsulating sub-layer, and a second inorganic encapsulating sub-layer.

Optionally, as shown in FIG. 1B, the counter substrate CS further includes an insulating layer ALD on a side of the quantum dots material layer QDML away from the second base substrate BS2, Optionally, the insulating layer ALD is between the quantum dots material layer QDML and the second encapsulating layer EN2.

Figure 3A:
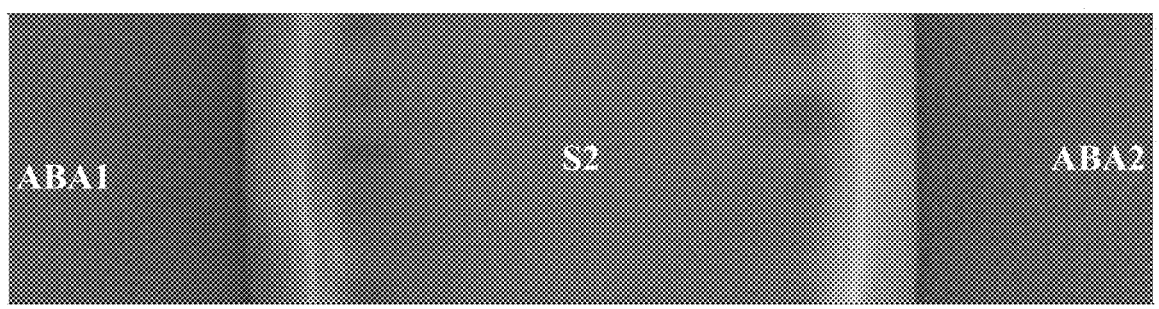
FIG. 3A is a scanning electron microscopy plan view image of a portion of a bank layer in some embodiments according to the present disclosure.
Figure 3B:
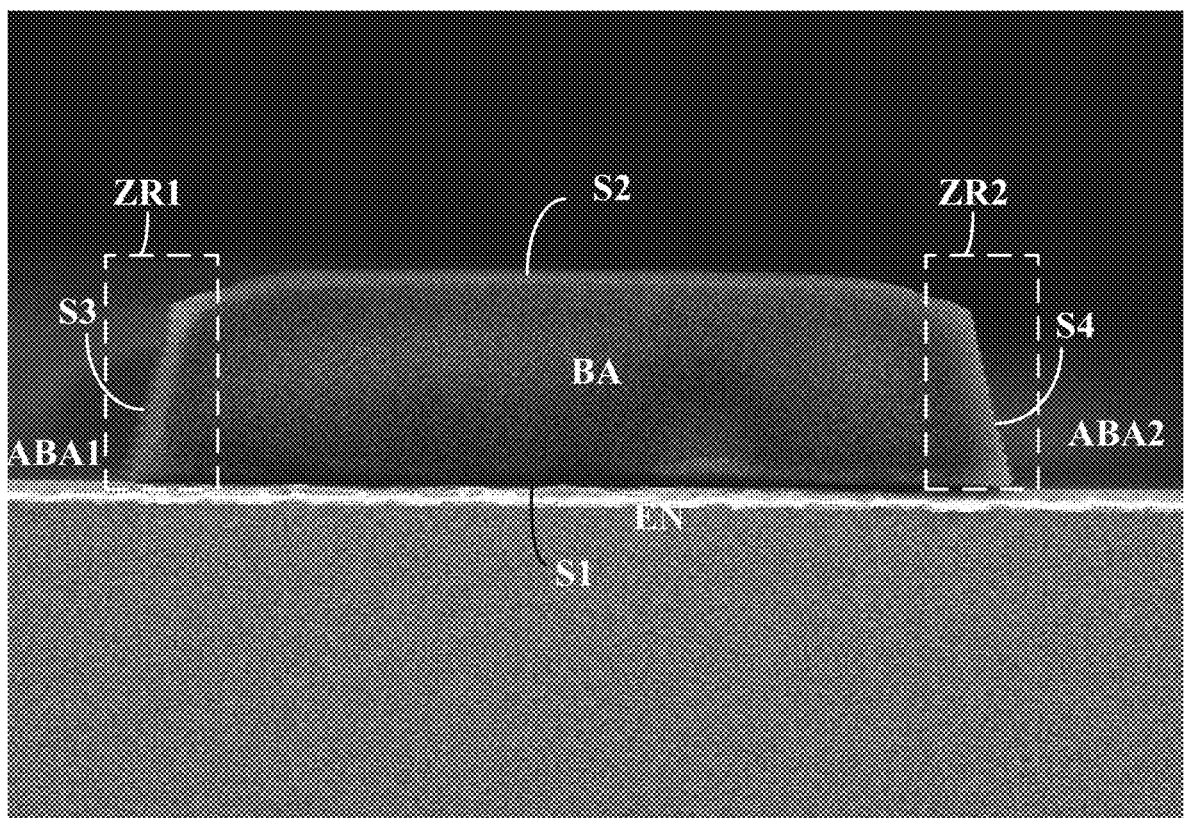
FIG. 3B is a scanning electron microscopy cross-sectional view image of a portion of a bank layer in some embodiments according to the present disclosure.

FIG. 3A is a scanning electron microscopy plan view image of a portion of a bank layer in some embodiments according to the present disclosure. FIG. 3B is a scanning electron microscopy cross-sectional view image of a portion of a bank layer in some embodiments according to the present disclosure. Referring to FIG. 3A and FIG. 3B, in some embodiments, at least a portion of the bank layer BL between two adjacent bank apertures ABA1 and ABA2 includes a first surface S1 in contact with the encapsulating layer EN, a second surface S2 opposite to the first surface S1, a third surface S3 connecting the first surface S1 and the second surface S2 closer to a first bank aperture of the two adjacent bank apertures ABA1 and ABA2, and a fourth surface S4 connecting the first surface S1 and the second surface S2 closer to a second bank aperture of the two adjacent bank apertures ABA1 and ABA2.

Figure 3C:
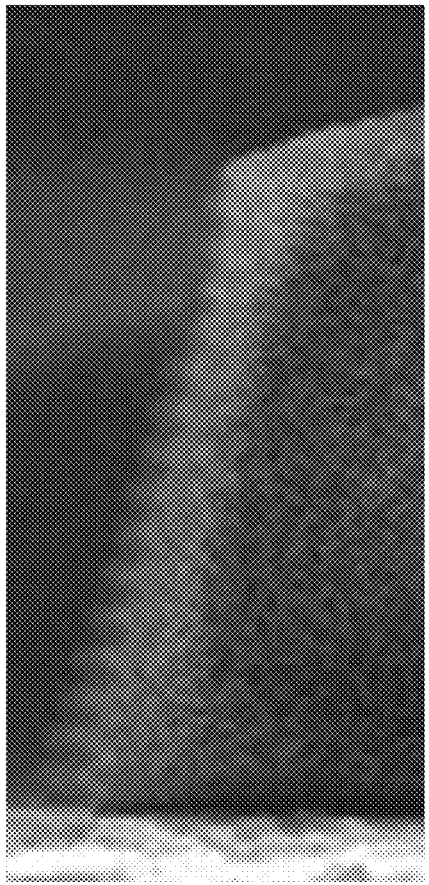
FIG. 3C is a zoom-in view of a first zoom-in region in FIG. 3B.
Figure 3D:
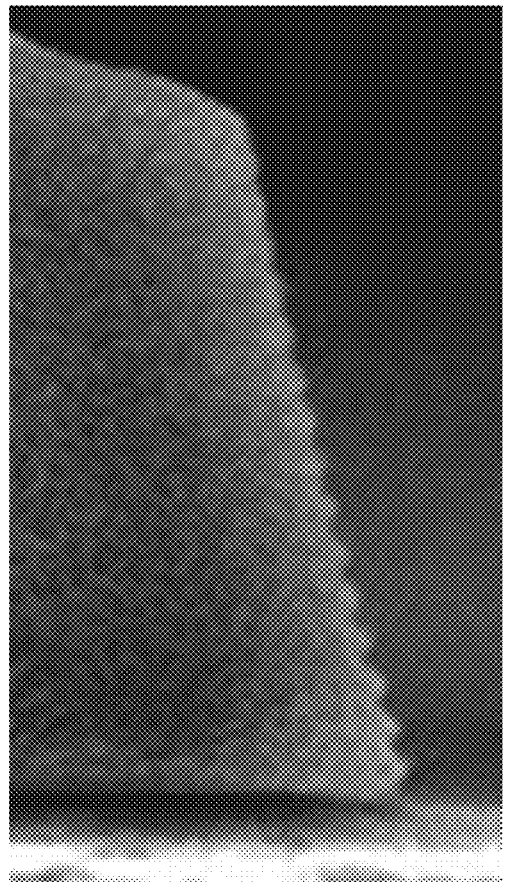
FIG. 3D is a zoom-in view of a second zoom-in region in FIG. 3B.
Figure 3E:
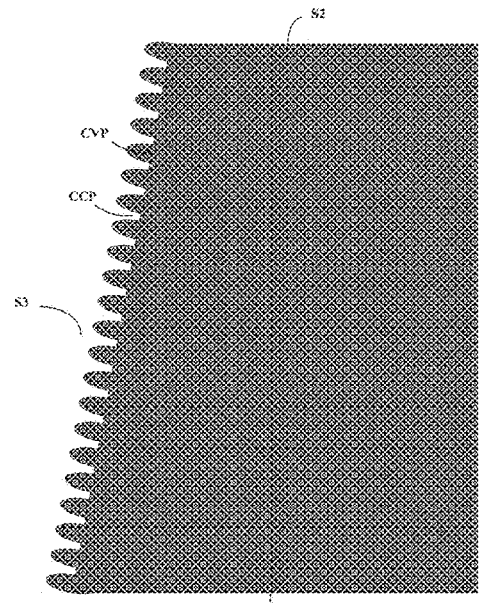
FIG. 3E is a schematic diagram illustrating the structure of a bank layer in a first zoom-in region in FIG. 3B.
Figure 3F:
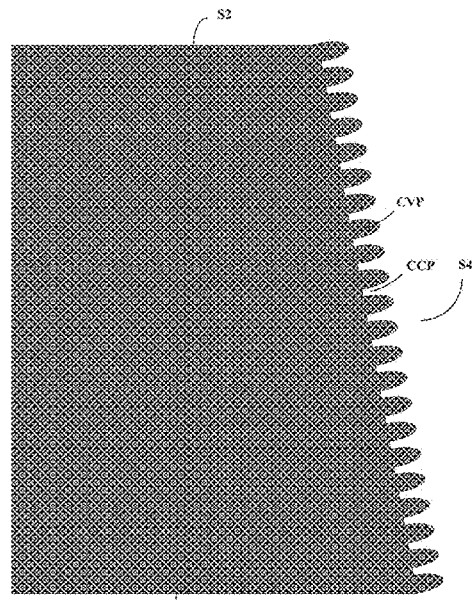
FIG. 3F is a schematic diagram illustrating the structure of a bank layer in a second zoom-in region in FIG. 3B.

FIG. 3C is a zoom-in view of a first zoom-in region in FIG. 3B. FIG. 3D is a zoom-in view of a second zoom-in region in FIG. 3B. FIG. 3E is a schematic diagram illustrating the structure of a bank layer in a first zoom-in region in FIG. 3B. FIG. 3F is a schematic diagram illustrating the structure of a bank layer in a second zoom-in region in FIG. 3B. Referring to FIG. 3A to FIG. 3F, in some embodiments, at least a portion of the third surface S3 is a wavy surface including alternating convex portions CVP and concave portions CCP; and at least a portion of the fourth surface S4 is a wavy surface comprising alternating convex portions CVP and concave portions CCP.

Referring to FIG. 1A again, the display panel in some embodiments further includes a barrier coating layer GCL (e.g., a graphene coating layer) in a respective one of the plurality of bank apertures BA. Optionally, the barrier coating layer is in direct contact with a respective one of the plurality of quantum dots blocks (e.g., QDB2 or QDB3).

Figure 4A:
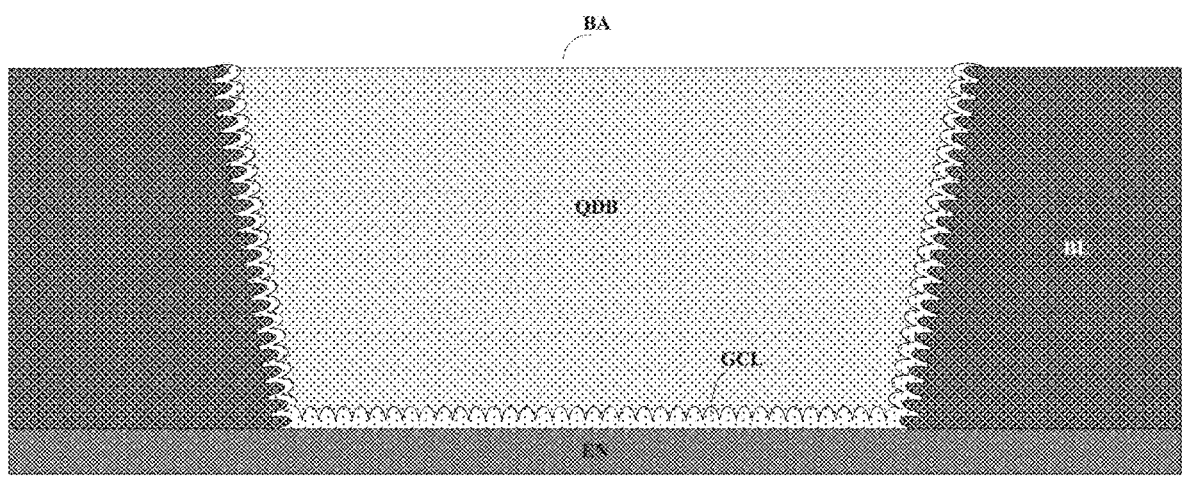
FIG. 4A is a partial cross-sectional view of a portion of a barrier coating layer in a respective one of a plurality of bank apertures in some embodiments according to the present disclosure.

FIG. 4A is a partial cross-sectional view of a portion of a barrier coating layer in a respective one of a plurality of bank apertures in some embodiments according to the present disclosure. Referring to FIG. 1A and FIG. 4A, in some embodiments, the barrier coating layer GCL (e.g., a graphene coating layer) is in direct contact with a respective one of the plurality of quantum dots blocks QDB. In the respective one of the plurality of bank apertures BA, the respective one of the plurality of quantum dots blocks QDB is on a side of a portion of the encapsulating layer EN away from the cathode layer CD. As shown in FIG. 4A, at least a portion of the barrier coating layer GCL is in direct contact with the portion of the encapsulating layer EN.

Figure 4B:
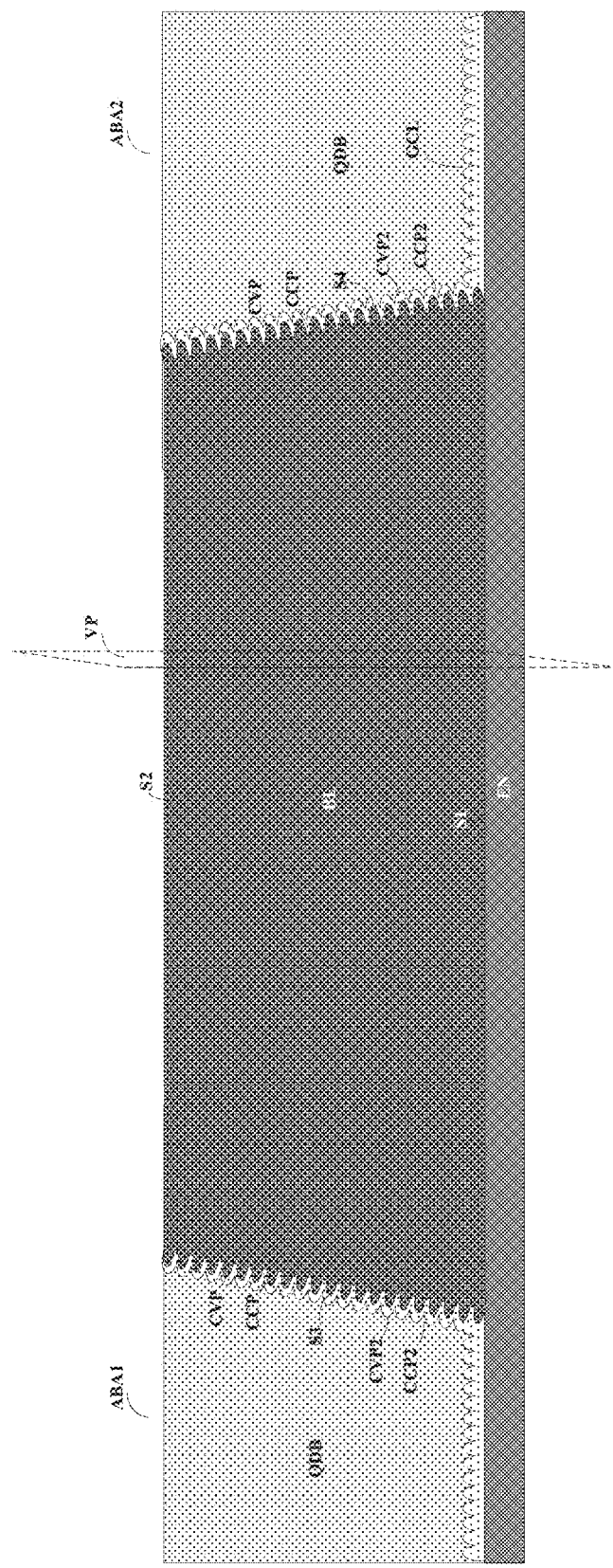
FIG. 4B is a partial cross-section view of a portion of the bank layer between two adjacent bank apertures in some embodiments according to the present disclosure.

FIG. 4B is a partial cross-section view of a portion of the bank layer between two adjacent bank apertures in some embodiments according to the present disclosure. Referring to FIG. 1A, FIG. 4A, and FIG. 4B, in some embodiments, at least a portion of the bank layer BL between two adjacent bank apertures ABA1 and ABA2 includes a first surface S1 in contact with the encapsulating layer EN, a second surface S2 opposite to the first surface S1, a third surface S3 connecting the first surface S1 and the second surface S2 closer to a first bank aperture of the two adjacent bank apertures ABA1 and ABA2, and a fourth surface S4 connecting the first surface S1 and the second surface S2 closer to a second bank aperture of the two adjacent bank apertures ABA1 and ABA2. In some embodiments, at least a portion of the third surface S3 is a wavy surface including alternating convex portions CVP and concave portions CCP; and at least a portion of the fourth surface S4 is a wavy surface comprising alternating convex portions CVP and concave portions CCP. In some embodiments, the barrier coating layer GCL (e.g., a graphene coating layer) is in direct contact with the at least a portion of the third surface S3 and in direct contact with the at least a portion of the fourth surface S4.

In some embodiments, in a respective one of plurality of bank apertures BA having a respective one of the plurality of quantum dots blocks QDB, an orthographic projection of the alternating convex portions CVP and concave portions CCP of the third surface S3 on a vertical plane VP at least partially overlaps with an orthographic projection of respective one of the plurality of quantum dots blocks QDB on the vertical plane VP. Optionally, in the respective one of plurality of bank apertures BA having the respective one of the plurality of quantum dots blocks QDB, the orthographic projection of respective one of the plurality of quantum dots blocks QDB on the base substrate BS covers the orthographic projection of the alternating convex portions CVP and concave portions CCP of the third surface S3 on the base substrate. The vertical plane VP is a plane perpendicular to the base substrate BS and perpendicular to a direction from the first bank aperture to the second bank aperture.

In some embodiments, in a respective one of plurality of bank apertures BA having a respective one of the plurality of quantum dots blocks QDB, an orthographic projection of the alternating convex portions CVP and concave portions CCP of the fourth surface S4 on the vertical plane VP at least partially overlaps with an orthographic projection of the respective one of the plurality of quantum dots blocks QDB on the vertical plane VP. Optionally, in the respective one of plurality of bank apertures BA having the respective one of the plurality of quantum dots blocks QDB, the orthographic projection of the respective one of the plurality of quantum dots blocks QDB on the vertical plane VP covers the orthographic projection of the alternating convex portions CVP and concave portions CCP of the fourth surface S4 on the vertical plane VP.

A cross-section of the bank layer BL along a direction from a first one of the two adjacent bank apertures ABA1 and ABA2 to a second one of the two adjacent bank apertures ABA1 and ABA2 may have various appropriate shapes. Examples of appropriate shapes include a trapezoidal shape, an inverted trapezoidal shape, a rectangular shape, a square shape, a triangular shape, etc. Having a trapezoidal shape or an inverted trapezoidal shape enhances light reflection, and is particularly suitable for a reflective-type display panel for enhancing light utilization efficiency.

Figure 4C:
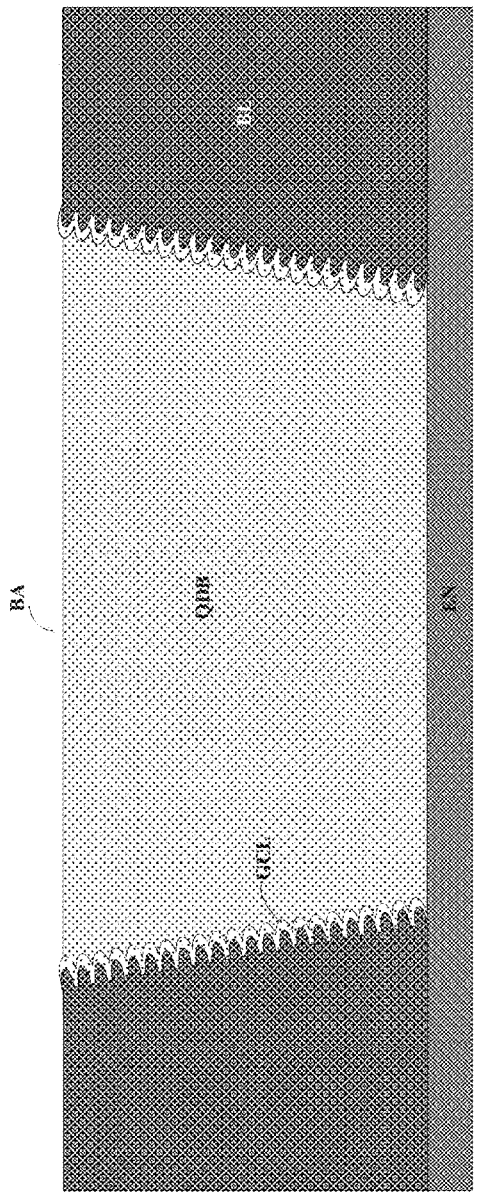
FIG. 4C is a partial cross-sectional view of a portion of a barrier coating layer in a respective one of a plurality of bank apertures in some embodiments according to the present disclosure.

FIG. 4C is a partial cross-sectional view of a portion of a barrier coating layer in a respective one of a plurality of bank apertures in some embodiments according to the present disclosure. Referring to FIG. 4C, in some embodiments, the barrier coating layer GCL is limited to lateral surfaces of the bank layer BL, for example, limited to the third surface S3 and the fourth surface S4. In one example, the display panel is absent of the barrier coating layer GCL at an interface between the quantum dots material layer QDML and the encapsulating layer EN.

Figure 4D:
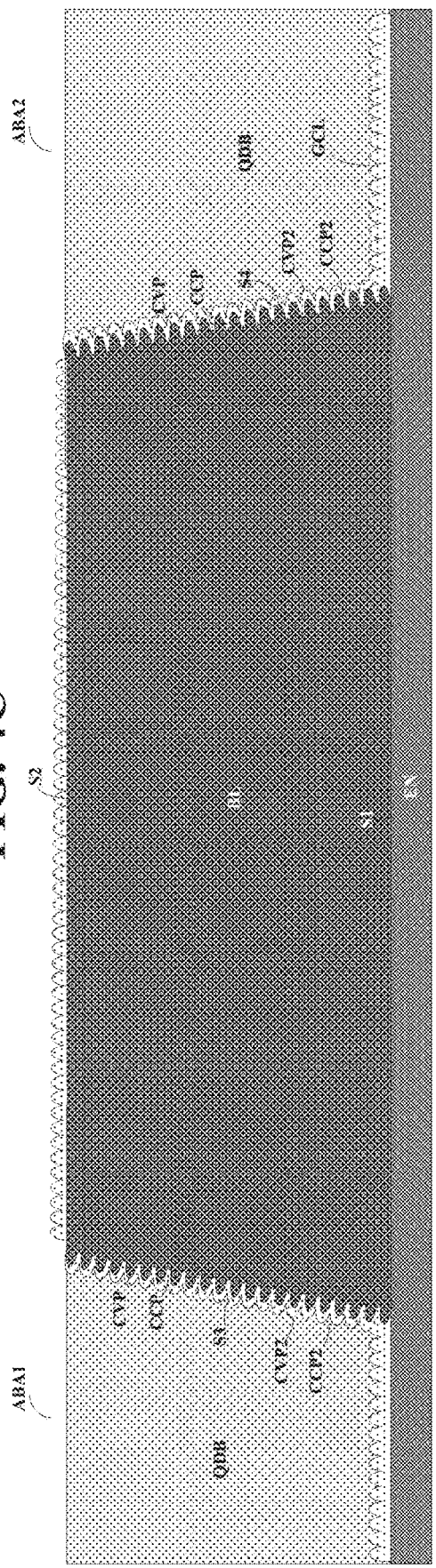
FIG. 4D is a partial cross-section view of a portion of the bank layer between two adjacent bank apertures in some embodiments according to the present disclosure.

FIG. 4D is a partial cross-section view of a portion of the bank layer between two adjacent bank apertures in some embodiments according to the present disclosure. Referring to FIG. 4D, in some embodiments, the barrier coating layer GCL further extends to the second surface S2. In one example, the barrier coating layer GCL (e.g., a graphene coating layer) is in direct contact with the at least a portion of the second surface S2.

Figure 5A:
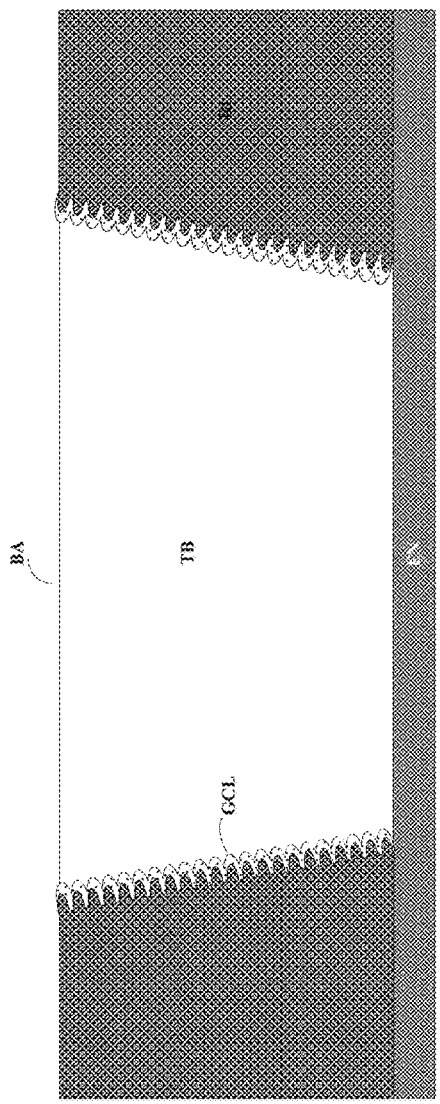
FIG. 5A is a partial cross-sectional view of a portion of a barrier coating layer in a respective one of a plurality of bank apertures in some embodiments according to the present disclosure.
Figure 5B:
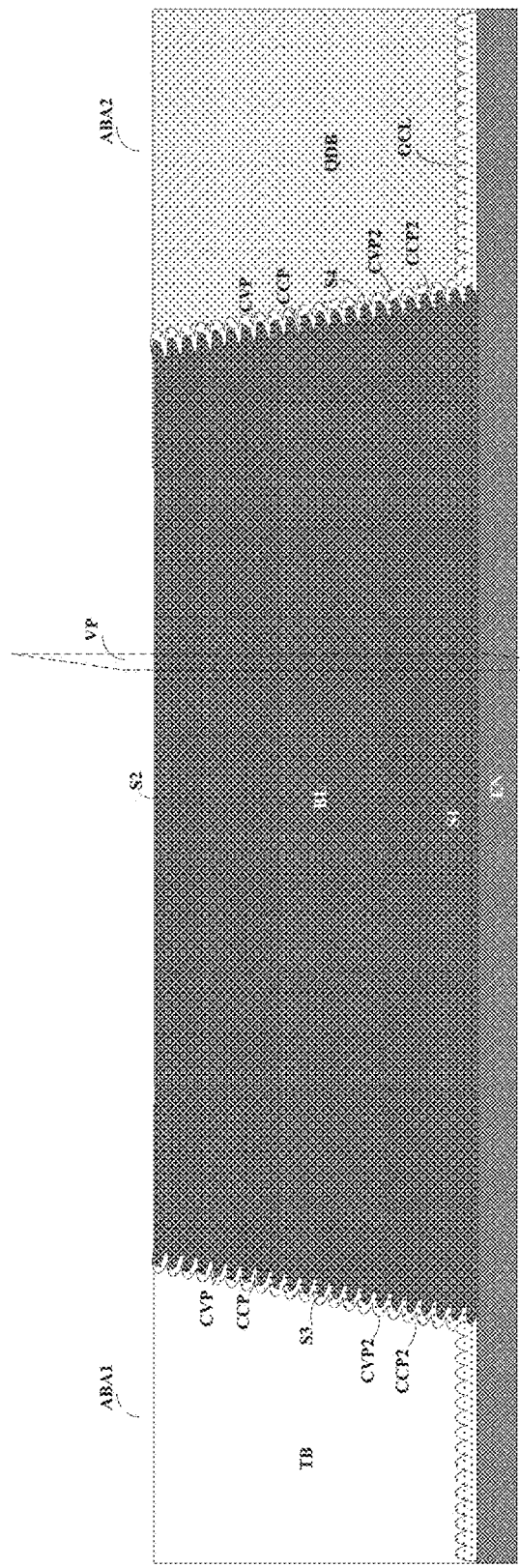
FIG. 5B is a partial cross-section view of a portion of the bank layer between two adjacent bank apertures in some embodiments according to the present disclosure.

As discussed above, in some embodiments, the quantum dots material layer QDML is absent in the bank apertures respectively in the plurality of subpixels of first color sp1. In one example, in the bank apertures respectively in the plurality of subpixels of first color sp1, the display panel includes a plurality of transparent blocks TB, as shown in FIG. 1A and FIG. 2. FIG. 5A is a partial cross-sectional view of a portion of a barrier coating layer in a respective one of a plurality of bank apertures in some embodiments according to the present disclosure. FIG. 5B is a partial cross-section view of a portion of the bank layer between two adjacent bank apertures in some embodiments according to the present disclosure. Referring to FIG. 1A, FIG. 5A, and FIG. 5B, in some embodiments, the barrier coating layer GCL (e.g., a graphene coating layer) is in direct contact with a respective one of the plurality of transparent blocks TB. In the respective one of the plurality of bank apertures BA, the respective one of the plurality of transparent blocks TB is on a side of a portion of the encapsulating layer EN away from the cathode layer CD. As shown in FIG. 5A, at least a portion of the barrier coating layer GCL is in direct contact with the portion of the encapsulating layer EN.

Referring to FIG. 4B and FIG. 5B, in some embodiments, a portion of the barrier coating layer GCL in direct contact with the at least a portion of the third surface S3 has a wavy surface including alternating convex portions CVP2 and concave portions CCP2. Optionally, a portion of the barrier coating layer GCL (e.g., a graphene coating layer) in direct contact with the at least a portion of the fourth surface S4 has a wavy surface comprising alternating convex portions CVP2 and concave portions CCP2.

In some embodiments, in a respective one of plurality of bank apertures BA having a respective one of the plurality of transparent blocks TB, an orthographic projection of the alternating convex portions CVP and concave portions CCP of the third surface S3 on a vertical plane VP at least partially overlaps with an orthographic projection of the respective one of the plurality of transparent blocks TB on the vertical plane VP. Optionally, in the respective one of plurality of bank apertures BA having the respective one of the plurality of transparent blocks TB, the orthographic projection of the respective one of the plurality of transparent blocks TB on the vertical plane VP covers the orthographic projection of the alternating convex portions CVP and concave portions CCP of the third surface S3 on the vertical plane VP. The vertical plane VP is a plane perpendicular to the base substrate BS and perpendicular to a direction from the first bank aperture to the second bank aperture.

In some embodiments, in a respective one of plurality of bank apertures BA having a respective one of the plurality of transparent blocks TB, an orthographic projection of the alternating convex portions CVP and concave portions CCP of the fourth surface S4 on the vertical plane VP at least partially overlaps with an orthographic projection of respective one of the plurality of transparent blocks TB on the vertical plane VP. Optionally, in the respective one of plurality of bank apertures BA having the respective one of the plurality of transparent blocks TB, the orthographic projection of respective one of the plurality of transparent blocks TB on the vertical plane VP covers the orthographic projection of the alternating convex portions CVP and concave portions CCP of the fourth surface S4 on the vertical plane VP.

Figure 5C:
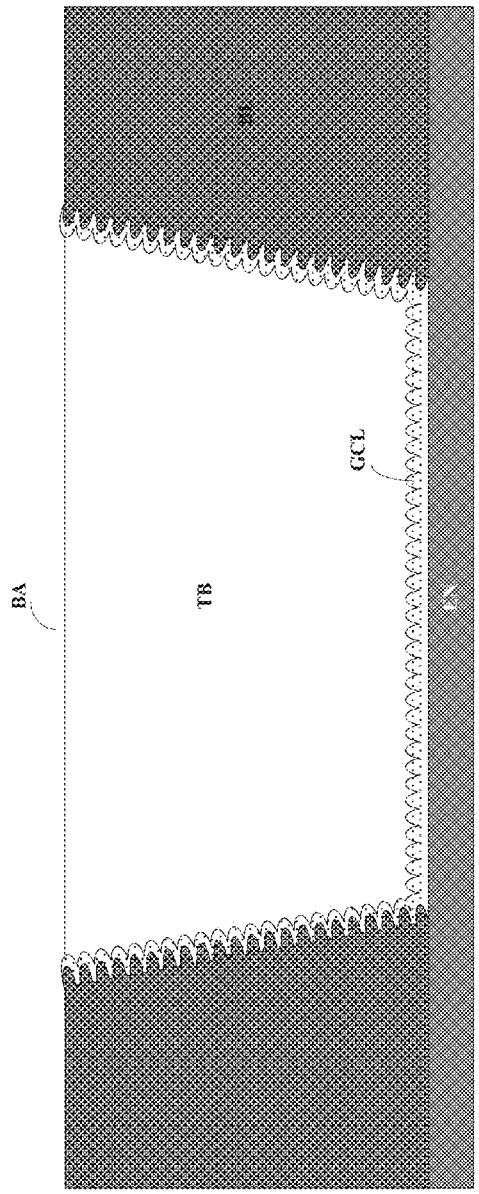
FIG. 5C is a partial cross-sectional view of a portion of a barrier coating layer in a respective one of a plurality of bank apertures in some embodiments according to the present disclosure.

FIG. 5C is a partial cross-sectional view of a portion of a barrier coating layer in a respective one of a plurality of bank apertures in some embodiments according to the present disclosure. Referring to FIG. 5C, in some embodiments, the barrier coating layer GCL is limited to lateral surfaces of the bank layer BL, for example, limited to the third surface S3 and the fourth surface S4. In one example, the display panel is absent of the barrier coating layer GCL at an interface between the respective one of the plurality of transparent blocks TB and the encapsulating layer EN.

Figure 5D:
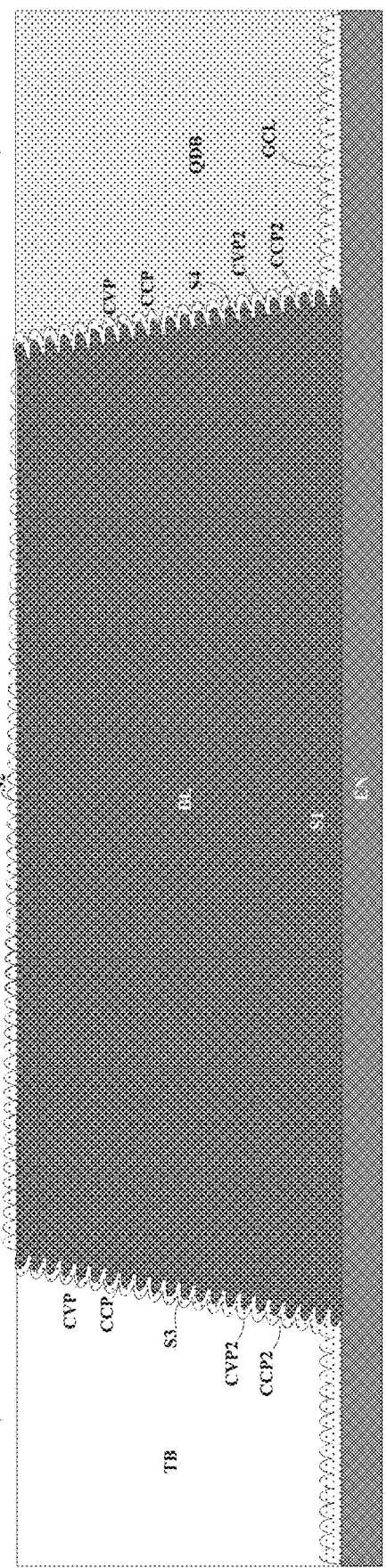
FIG. 5D is a partial cross-section view of a portion of the bank layer between two adjacent bank apertures in some embodiments according to the present disclosure.

FIG. 5D is a partial cross-section view of a portion of the bank layer between two adjacent bank apertures in some embodiments according to the present disclosure. Referring to FIG. 5D, in some embodiments, the barrier coating layer GCL further extends to the second surface S2. In one example, the barrier coating layer GCL (e.g., a graphene coating layer) is in direct contact with the at least a portion of the second surface S2.

Various appropriate insulating materials and various appropriate fabricating methods may be used to make the quantum dots material layer QDML. Examples of quantum dots materials include CdS, CdSe, CdTe, ZnSe, InP, PbS, CsPbCl3, CsPbBr3, CsPhI3, CsPbClxBr3-x, CsPbBrxI3-x, CdS/ZnS, CdSe/ZnS, ZnSe, InP/ZnS, PbS/ZnS, CsPbCl/ZnS, CsPbBr3/ZnS, CsPhI3/ZnS, CsPbClxBr3-x/ZnS, CsPbBrxI3-x/ZnS, and a combination thereof, where x<3.

Various appropriate insulating materials and various appropriate fabricating methods may be used to make the bank layer BL. For example, an insulating material may be deposited on the substrate by a plasma-enhanced chemical vapor deposition (PECVD) process. Examples of appropriate insulating materials for making the bank layer BL include organic insulating materials and inorganic insulating materials. Examples of organic insulating materials include photoresist materials, photosensitive polyimide, resin materials (e.g., a photosensitive diazonaphtho-quinone-phenolic resin), and acrylate materials. Examples of inorganic insulating materials include silicon nitride (SiNx), silicon oxide (SiOx), and silicon oxide nitride (SiO$_x$N$_y$). The bank layer BL may have any appropriate color. Examples of colors of the bank layer BL include black, yellow, gray, and white.

In the present display panel, at least a portion of the third surface is a wavy surface comprising alternating convex and concave portions; and at least a portion of the fourth surface is a wavy surface comprising alternating convex and concave portions. Thus, lateral walls of the respective one of the plurality of bank apertures BA have wavy surfaces. Light emitted from a respective one of the plurality of light emitting blocks EL can be repeatedly reflected on the wavy surfaces of the lateral walls. The inventors of the present disclosure discover that, surprisingly and unexpectedly, the repeated reflection of light inside the respective one of the plurality of bank apertures BA significantly enhances light emission efficiency. Moreover, the wavy surfaces inside the respective one of the plurality of bank apertures BA can effectively reduce surface free energy of an ink disposed in the respective one of the plurality of bank apertures BA. The ink droplet disposed in the respective one of the plurality of bank apertures BA can be more evenly distributed throughout the center and edges of the droplet. As a result, cross-contamination between ink droplets respectively disposed in adjacent bank apertures can be prevented, and a more planar light emitting block can be formed when the ink droplet is dried.

Various appropriate barrier coating materials and various appropriate fabricating methods may be used to make the barrier coating layer GCL. Optionally, the barrier coating material is a material having relatively high hermeticity. A method of measuring the hermeticity of the barrier coating material is the Wet Dissipation Factor test (the Wet DF test). Optionally, the barrier coating material is a material having light transmittance for blue light greater than 90%, e.g., greater than 95%, greater than 99%. For example, a graphene material may be deposited on the substrate by a plasma-enhanced chemical vapor deposition (PECVD) process. Optionally, a surface plasma treatment is performed on the deposited graphene material to form surface functionalized graphene on a surface of the graphene material layer, thereby forming the graphene coating layer GCL. Optionally, the graphene coating layer GCL includes surface functionalized graphene. Optionally, the surface functionalized graphene is a plasma functionalized graphene. Examples of functionalized graphene includes graphene material having one or more of surface functional groups selected from a group consisting of a hydroxyl group (—OH), a carboxyl group (—COOH), an amine group (—NH2), a sulfhydryl group (—SH), a nitrile group (—CN), a sulfinic group (—SOOH), a secondary amide group (—CONH—), a secondary amine group (—NH—), a sulfonic acid group (—SO3H), and a primary amide group (—CONH2). The one or more of surface functional groups bind, through interactions comprising hydrogen bonds, to functional groups in quantum dots materials in the respective one of the plurality of quantum dots blocks.

Optionally, the barrier coating layer GCL has a thickness in a range of 20 nm to 100 nm, e.g., 20 nm to 30 nm, 30 nm to 40 nm, 40 nm to 50 nm, 50 nm to 60 nm, 60 nm to 70 nm, 70 nm to 80 nm, 80 nm to 90 nm, or 90 nm to 100 nm.

In the present display panel, the barrier coating layer GCL includes surface functionalized graphene. The inventors of the present disclosure discover that, surprisingly and unexpectedly, the functional groups on the surface of the barrier coating layer GCL bind, for example, through hydrogen bonds, to functional groups in the quantum dots materials disposed into the plurality of bank apertures BA. The bonding between the barrier coating layer GCL and the quantum dots blocks further prevents cross-contamination between ink droplets respectively disposed in adjacent bank apertures. Moreover, the functionalized graphene provides additional printing sites for disposing the quantum dots ink, which makes it possible to form the quantum dots blocks with a reduced thickness.

In another aspect, the present disclosure provides a display apparatus. In some embodiments, the display apparatus includes the display panel described herein or fabricated by a method described herein, and an integrated circuit connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating a display panel. In some embodiments, the method includes forming a bank layer on a base substrate, the bank layer formed to define a plurality of bank apertures; and forming a quantum dots material layer on the base substrate, forming the quantum dots material layer comprising forming a plurality of quantum dots blocks respectively in at least some of the plurality of bank apertures. Optionally, the bank layer and the pixel definition layer are formed in an inter-subpixel region of the display panel. Optionally, an orthographic projection of the bank layer on the base substrate at least partially overlaps with an orthographic projection of the pixel definition layer on the base substrate.

In some embodiments, the bank layer is formed so that at least a portion of the bank layer between two adjacent bank apertures comprises a first surface in contact with the encapsulating layer, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures; at least a portion of the third surface is a wavy surface comprising alternating convex and concave portions; and at least a portion of the fourth surface is a wavy surface comprising alternating convex and concave portions.

In some embodiments, forming the bank layer includes forming a photoresist layer on the base substrate; exposing the photoresist layer with a light under a condition to induce standing wave effect on exposing the photoresist layer; and developing an exposed photoresist layer to form the bank layer having wavy surfaces as a result of the standing wave effect. In some embodiments, the light beam for exposing the photoresist layer is under a condition so that the light beam transmits through air, the base substrate, various layers on the base substrate. The light beam is reflected at various interfaces among the air, the base substrate, and the various layers on the base substrate, resulting in constructive interference and destructive interference so as to form a standing wave effect in the photoresist layer. After the exposure and development, a profile of the photoresist layer has an undulated pattern. Optionally, the profile has a saw-toothed pattern.

In some embodiments, the method further includes forming a barrier coating layer in a respective one of the plurality of bank apertures. Optionally, forming the quantum dots material layer includes ink-jet printing a quantum dots material solution into the respective one of the plurality of bank apertures, and drying the quantum dots material solution. Optionally, a respective one of the plurality of quantum dots blocks is formed to be in direct contact with the barrier coating layer.

In some embodiments, an entire process of forming the barrier coating layer is performed at a temperature less than 100 degrees. In some embodiments, an entire process of forming the bank layer is performed at a temperature less than 100 degrees.

In some embodiments, forming the barrier coating layer includes depositing a graphene material layer in the respective one of the plurality of bank apertures; and performing a surface plasma treatment on the graphene material layer to form surface functionalized graphene on a surface of the graphene material layer. Optionally, the surface functionalized graphene comprises one or more of surface functional groups selected from a group consisting of a hydroxyl group (—OH), a carboxyl group (—COOH), an amine group (—NH2), a sulfhydryl group (—SH), a nitrile group (—CN), a sulfinic group (—SOOH), a secondary amide group (—CONH—), a secondary amine group (—NH—), a sulfonic acid group (—SO3H), and a primary amide group (—CONH2). Optionally, during ink-jet printing the quantum dots material solution into the respective one of the plurality of bank apertures, the one or more of surface functional groups on the surface of the barrier coating layer bind, through interactions comprising hydrogen bonds, to functional groups in the quantum dots materials disposed into the respective one of the plurality of bank apertures.

In another aspect, the present disclosure provides a counter substrate. In some embodiments, the counter substrate includes a second base substrate; a bank layer on the second base substrate, the bank layer defining a plurality of bank apertures; a barrier coating layer in a respective one of the plurality of bank apertures; a quantum dots material layer on the second base substrate, the quantum dots material layer comprising a plurality of quantum dots blocks respectively in at least some of the plurality of bank apertures; and an overcoat layer on a side of the quantum dots material layer, the bank layer, and the barrier coating layer away from the second base substrate. Optionally, the barrier coating layer is in direct contact with a respective one of the plurality of quantum dots blocks. As discussed above, the inventors of the present disclosure surprisingly and unexpectedly discover that a quantum dots material layer with a high degree of evenness can be formed due to, for example, the wavy surface of the bank layer, the barrier coating layer, and the wavy surface of the barrier coating layer. The overcoat layer formed on the quantum dots material layer can thus achieve a high degree of evenness.

Figure 6:
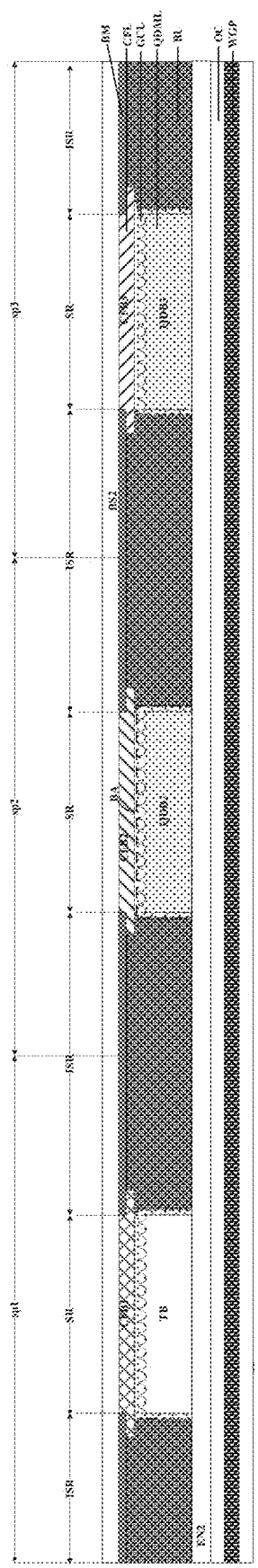
FIG. 6 is a schematic diagram illustrating the structure of a counter substrate in some embodiments according to the present disclosure.
Figure 7:
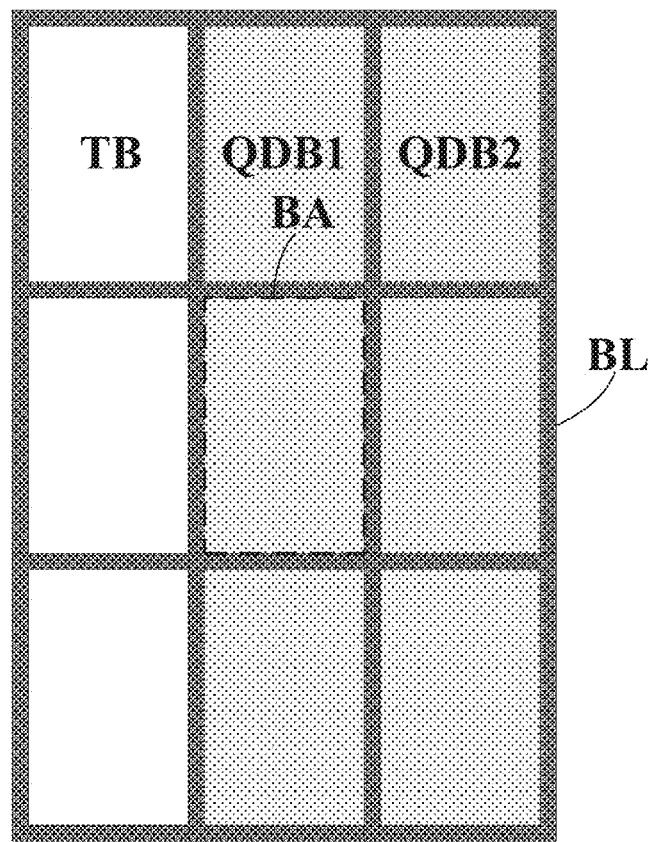
FIG. 7 is a plan view of a bank layer and a quantum dots layer in a display panel in some embodiments according to the present disclosure.

FIG. 6 is a schematic diagram illustrating the structure of a counter substrate in some embodiments according to the present disclosure. FIG. 7 is a plan view of a bank layer and a quantum dots layer in a display panel in some embodiments according to the present disclosure. Referring to FIG. 6 and FIG. 7, the counter substrate in some embodiments includes a second base substrate BS2; a bank layer BL on the second base substrate BS2, the bank layer BL defining a plurality of bank apertures BA; a barrier coating layer GCL (e.g., a graphene coating layer) in a respective one of the plurality of bank apertures BA; a quantum dots material layer QDML on the second base substrate BS2, the quantum dots material layer QDML including a plurality of quantum dots blocks (e.g., QDB2 or QDB3) respectively in at least some of the plurality of bank apertures BA; and an overcoat layer OC on a side of the quantum dots material layer QDML, the bank layer BL, and the barrier coating layer GCL away from the second base substrate BS2. Optionally, the barrier coating layer GCL is in direct contact with a respective one of the plurality of quantum dots blocks.

In some embodiments, the counter substrate further includes a second encapsulating layer EN2 encapsulating the quantum dots material layer QDML including the plurality of quantum dots blocks (e.g., QDB2 and QDB3). Optionally, the second encapsulating layer EN2 further encapsulates the plurality of transparent blocks TB. Optionally, the second encapsulating layer EN2 is on a side of the quantum dots material layer QDML away from the second base substrate BS2. Optionally, the second encapsulating layer EN2 further encapsulates the plurality of transparent blocks TB.

Referring to FIG. 6, regions in the counter substrate respectively corresponding to a plurality of subpixels are denoted. In some embodiments, the display panel includes a plurality of subpixels. In one example, the display panel includes a plurality of subpixels of first color sp1 (e.g., blue subpixels), a plurality of subpixels of second color sp2 (e.g., red subpixels), and a plurality of subpixels of third color sp3 (e.g., green subpixels). Optionally, the bank layer BL is in an inter-subpixel region ISR of the counter substrate.

In some embodiments, the quantum dots material layer QDML includes a plurality of quantum dots blocks respectively in at least some of the plurality of bank apertures BA. In one example, the quantum dots material layer QDML includes a plurality of quantum dots blocks of a second color QDB2 respectively in bank apertures respectively in the plurality of subpixels of second color sp2, and a plurality of quantum dots blocks of a third color QDB3 respectively in bank apertures respectively in the plurality of subpixels of third color sp3.

Optionally, the quantum dots material layer QDML further includes a plurality of quantum dots blocks of a first color respectively in bank apertures respectively in the plurality of subpixels of first color sp1.

Optionally, the quantum dots material layer QDML is absent in the bank apertures respectively in the plurality of subpixels of first color sp1. In one example, in the bank apertures respectively in the plurality of subpixels of first color sp1, the counter substrate includes a plurality of transparent blocks TB, as shown in FIG. 1A and FIG. 2. In another example, in the bank apertures respectively in the plurality of subpixels of first color sp1, the display panel includes color filter blocks of the first color.

In some embodiments, the counter substrate further includes a color filter layer CFL on a side of the quantum dots material layer QDML away from the overcoat layer OC. In some embodiments, the color filter layer CFL includes a plurality of color filter blocks respectively on a side of the plurality of bank apertures BA away from the overcoat layer OC. In one example, the color filter layer CFL includes a plurality of color filter blocks of a first color CFB1 (e.g., blue color filter blocks) in the plurality of subpixels of the first color (e.g., blue subpixels), a plurality of color filter blocks of a second color CFB1 (e.g., red color filter blocks) in the plurality of subpixels of the second color (e.g., red subpixels), and a plurality of color filter blocks of a third color CFB1 (e.g., green color filter blocks) in the plurality of subpixels of the third color (e.g., green subpixels).

Figure 8A:
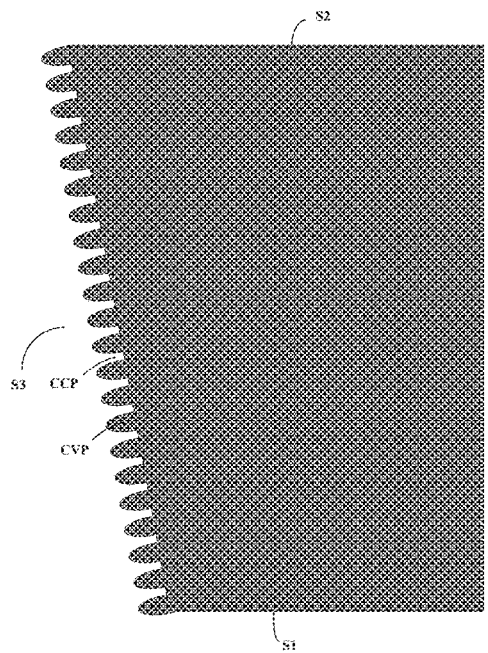
FIG. 8A is a schematic diagram illustrating a partial structure of a bank layer in some embodiments according to the present disclosure.
Figure 8B:
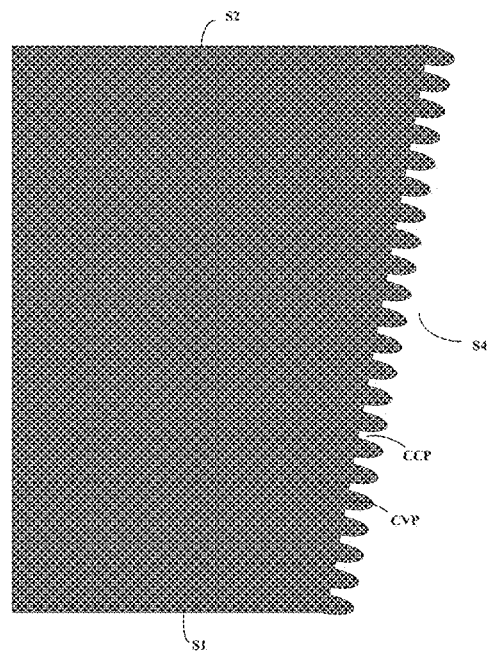
FIG. 8B is a schematic diagram illustrating a partial of a bank layer in some embodiments according to the present disclosure.

FIG. 8A is a schematic diagram illustrating a partial structure of a bank layer in some embodiments according to the present disclosure. FIG. 8B is a schematic diagram illustrating a partial of a bank layer in some embodiments according to the present disclosure. Referring to FIG. 8A and FIG. 8B, in some embodiments, at least a portion of the bank layer BL between two adjacent bank apertures ABA1 and ABA2 includes a first surface S1 in contact with the overcoat layer OC, a second surface S2 opposite to the first surface S1, a third surface S3 connecting the first surface S1 and the second surface S2 closer to a first bank aperture of the two adjacent bank apertures ABA1 and ABA2, and a fourth surface S4 connecting the first surface S1 and the second surface S2 closer to a second bank aperture of the two adjacent bank apertures ABA1 and ABA2. In some embodiments, at least a portion of the third surface S3 is a wavy surface including alternating convex portions CVP and concave portions CCP; and at least a portion of the fourth surface S4 is a wavy surface comprising alternating convex portions CVP and concave portions CCP.

Referring to FIG. 6 again, the counter substrate in some embodiments further includes a barrier coating layer GCL in a respective one of the plurality of bank apertures BA. Optionally, the barrier coating layer (e.g., a graphene coating layer) is in direct contact with a respective one of the plurality of quantum dots blocks (e.g., QDB2 or QDB3).

Figure 9A:
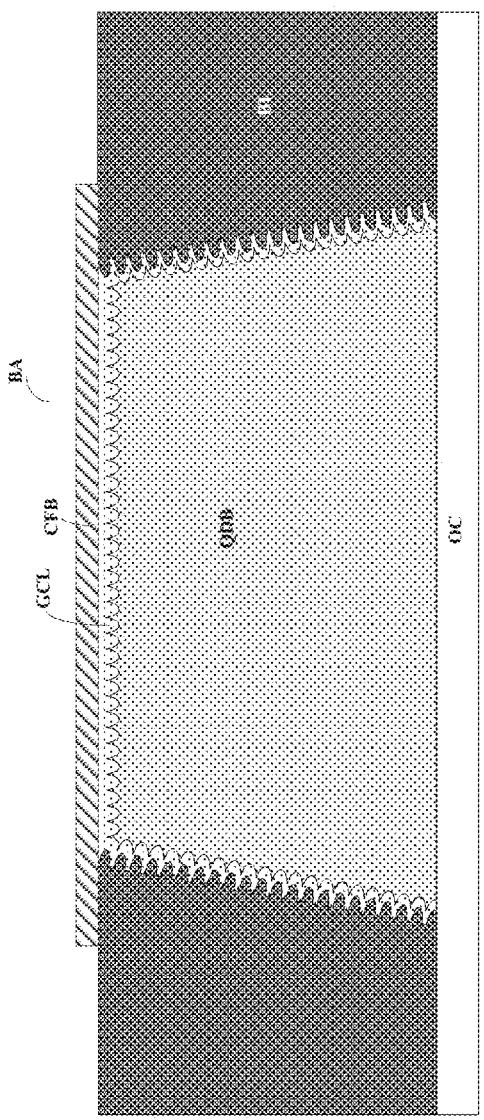
FIG. 9A is a partial cross-sectional view of a portion of a barrier coating layer in a respective one of a plurality of bank apertures in some embodiments according to the present disclosure.

FIG. 9A is a partial cross-sectional view of a portion of a barrier coating layer in a respective one of a plurality of bank apertures in some embodiments according to the present disclosure. Referring to FIG. 6 and FIG. 9A, in some embodiments, the barrier coating layer GCL (e.g., a graphene coating layer) is in direct contact with a respective one of the plurality of quantum dots blocks QDB. In the respective one of the plurality of bank apertures BA, the respective one of the plurality of quantum dots blocks QDB is on a portion of the overcoat layer OC, and optionally in direct contact with the portion of the overcoat layer OC. As shown in FIG. 4A, at least a portion of the barrier coating layer GCL is on a side of the respective one of the plurality of quantum dots blocks QDB away from the overcoat layer OC. Optionally, the portion of the barrier coating layer GCL is between a respective one of the plurality of color filter blocks CFB and the respective one of the plurality of quantum dots blocks QDB. Optionally, the portion of the barrier coating layer GCL is in direct contact with the respective one of the plurality of color filter blocks CFB, and in direct contact with the respective one of the plurality of quantum dots blocks QDB.

Figure 9B:
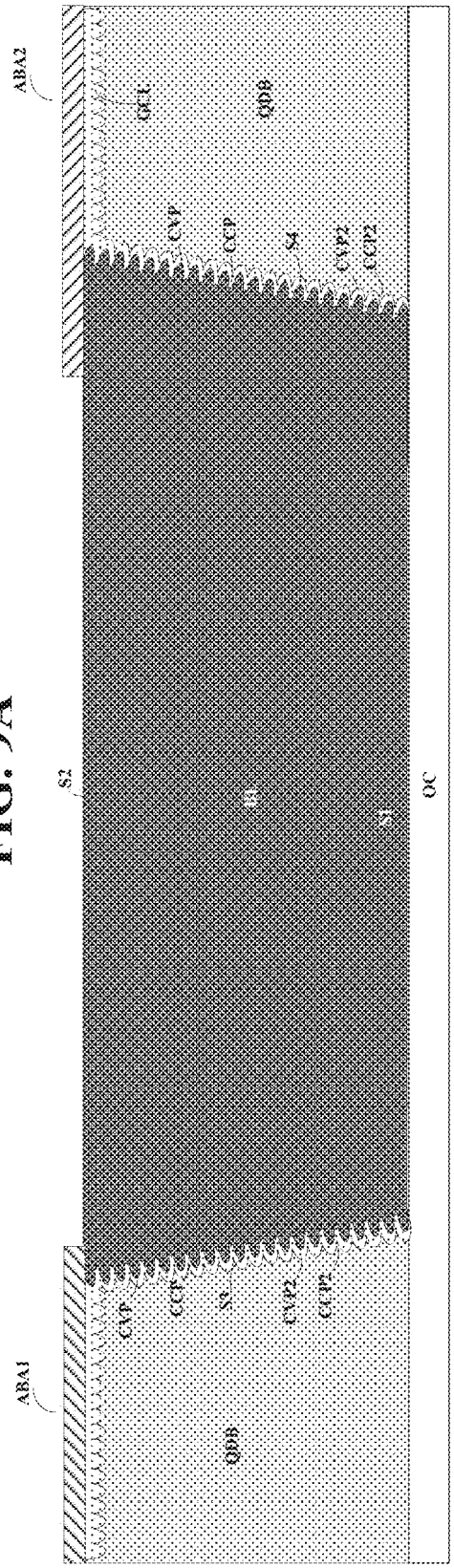
FIG. 9B is a partial cross-section view of a portion of the bank layer between two adjacent bank apertures in some embodiments according to the present disclosure.

FIG. 9B is a partial cross-section view of a portion of the bank layer between two adjacent bank apertures in some embodiments according to the present disclosure. Referring to FIG. 6, FIG. 9A, and FIG. 9B, in some embodiments, at least a portion of the bank layer BL between two adjacent bank apertures ABA1 and ABA2 includes a first surface S1 in contact with the overcoat layer OC, a second surface S2 opposite to the first surface S1, a third surface S3 connecting the first surface S1 and the second surface S2 closer to a first bank aperture of the two adjacent bank apertures ABA1 and ABA2, and a fourth surface S4 connecting the first surface S1 and the second surface S2 closer to a second bank aperture of the two adjacent bank apertures ABA1 and ABA2. In some embodiments, at least a portion of the third surface S3 is a wavy surface including alternating convex portions CVP and concave portions CCP; and at least a portion of the fourth surface S4 is a wavy surface comprising alternating convex portions CVP and concave portions CCP. In some embodiments, the barrier coating layer GCL is in direct contact with the at least a portion of the third surface S3 and in direct contact with the at least a portion of the fourth surface S4.

Figure 10A:
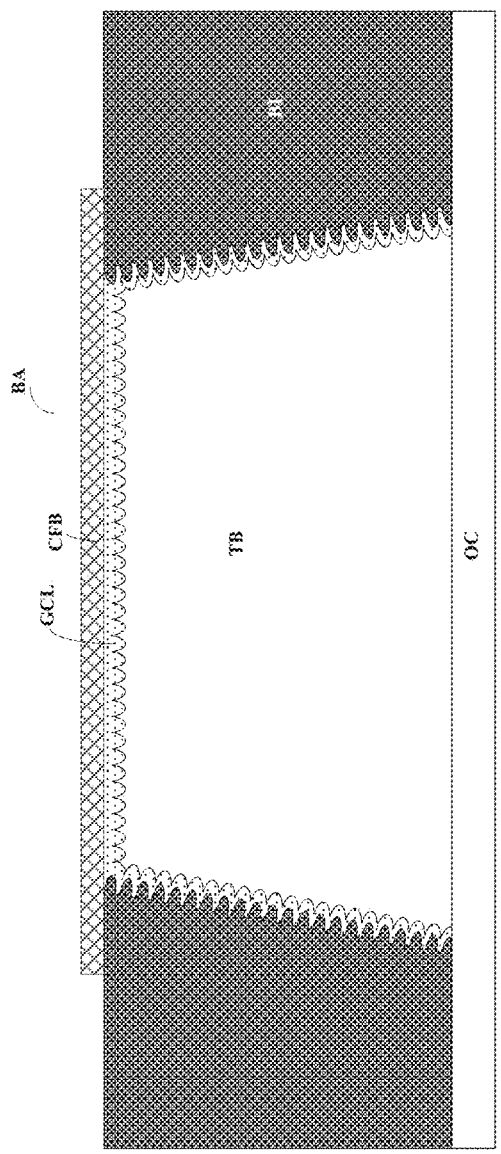
FIG. 10A is a partial cross-sectional view of a portion of a barrier coating layer in a respective one of a plurality of bank apertures in some embodiments according to the present disclosure.
Figure 10B:
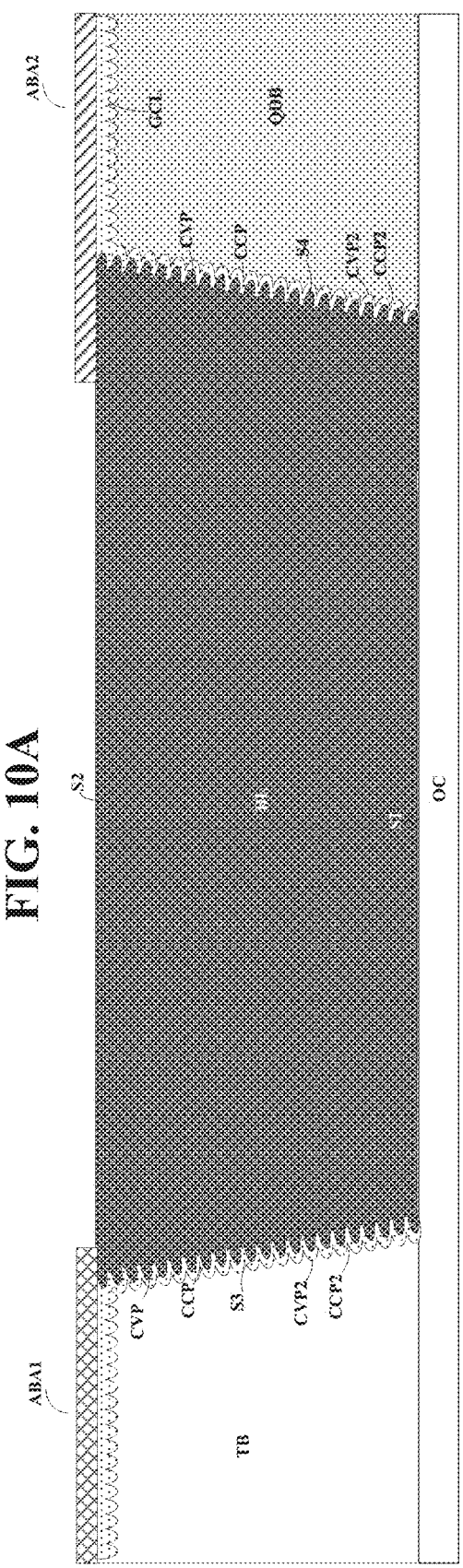
FIG. 10B is a partial cross-section view of a portion of the bank layer between two adjacent bank apertures in some embodiments according to the present disclosure.

As discussed above, in some embodiments, the quantum dots material layer QDML is absent in the bank apertures respectively in the plurality of subpixels of first color sp1. In one example, in the bank apertures respectively in the plurality of subpixels of first color sp1, the counter substrate includes a plurality of transparent blocks TB, as shown in FIG. 6 and FIG. 7. FIG. 10A is a partial cross-sectional view of a portion of a barrier coating layer in a respective one of a plurality of bank apertures in some embodiments according to the present disclosure. FIG. 10B is a partial cross-section view of a portion of the bank layer between two adjacent bank apertures in some embodiments according to the present disclosure. Referring to FIG. 6, FIG. 10A, and FIG. 10B, in some embodiments, the barrier coating layer GCL (e.g., a graphene coating layer) is in direct contact with a respective one of the plurality of transparent blocks TB. In the respective one of the plurality of bank apertures BA, the respective one of the plurality of transparent blocks TB is on a portion of the overcoat layer OC, and optionally in direct contact with the portion of the overcoat layer OC. As shown in FIG. 10A, at least a portion of the barrier coating layer GCL is on a side of the respective one of the plurality of transparent blocks TB away from the overcoat layer OC. Optionally, the portion of the barrier coating layer GCL is between a respective one of the plurality of color filter blocks CFB and the respective one of the plurality of transparent blocks TB. Optionally, the portion of the barrier coating layer GCL is in direct contact with the respective one of the plurality of color filter blocks CFB, and in direct contact with the respective one of the plurality of transparent blocks TB.

Referring to FIG. 9B and FIG. 10B, in some embodiments, a portion of the barrier coating layer GCL in direct contact with the at least a portion of the third surface S3 has a wavy surface including alternating convex portions CVP2 and concave portions CCP2. Optionally, a portion of the barrier coating layer GCL in direct contact with the at least a portion of the fourth surface S4 has a wavy surface comprising alternating convex portions CVP2 and concave portions CCP2.

In the present display panel, at least a portion of the third surface is a wavy surface comprising alternating convex and concave portions; and at least a portion of the fourth surface is a wavy surface comprising alternating convex and concave portions. Thus, lateral walls of the respective one of the plurality of bank apertures BA have wavy surfaces. The wavy surfaces inside the respective one of the plurality of bank apertures BA can effectively reduce surface free energy of an ink disposed in the respective one of the plurality of bank apertures BA. The ink droplet disposed in the respective one of the plurality of bank apertures BA can be more evenly distributed throughout the center and edges of the droplet. As a result, cross-contamination between ink droplets respectively disposed in adjacent bank apertures can be prevented, and a more planar light emitting block can be formed when the ink droplet is dried. In addition, the barrier coating layer GCL includes surface functionalized graphene. The functional groups on the surface of the barrier coating layer GCL bind, for example, through hydrogen bonds, to functional groups in the quantum dots materials disposed into the plurality of bank apertures BA. The bonding between the barrier coating layer GCL and the quantum dots blocks further prevents cross-contamination between ink droplets respectively disposed in adjacent bank apertures. Moreover, the functionalized graphene provides additional printing sites for disposing the quantum dots ink, which makes it possible to form the quantum dots blocks with a reduced thickness. Because a highly planar quantum dots material layer QDML can be formed in the present counter substrate, the overcoat layer OC formed on the quantum dots material layer QDML can achieve an ultra-high degree of evenness.

In some embodiments, and referring to FIG. 6, the counter substrate further includes a wire grid polarizer WGP on a side of the overcoat layer OC away from the second base substrate BS2. Optionally, the wire grid polarizer WGP is in direct contact with the overcoat layer OC. Optionally, wires of the wire grid polarizer WGP have a line width in a range of 25 nm to 95 nm, e.g., 25 nm to 35 nm, 35 nm to 45 nm, 45 nm to 55 nm, 55 nm to 65 nm, 65 nm to 75 nm, 75 nm to 85 nm, or 85 nm to 95 nm. Optionally, the wires of the wire grid polarizer WGP have a line width of 50 nm. Optionally, the wire grid polarizer WGP is formed by patterning (e.g., etching) a conductive material layer deposited on the overcoat layer OC. Because the overcoat layer OC in the present counter substrate can be formed to achieve an ultra-high degree of evenness, defects in patterning the conductive material layer can be prevented or eliminated altogether. Not only that wire peeling issues may be obviated, surprisingly and unexpectedly, an ultra-high degree of polarization can be achieved in the wire grid polarizer WGP. In one example, the degree of polarization is greater than 99.9%, e.g., greater than 99.95%, greater than 99.99%, greater than 99.9995%, or greater than 99.9999/0.

Figure 11A:
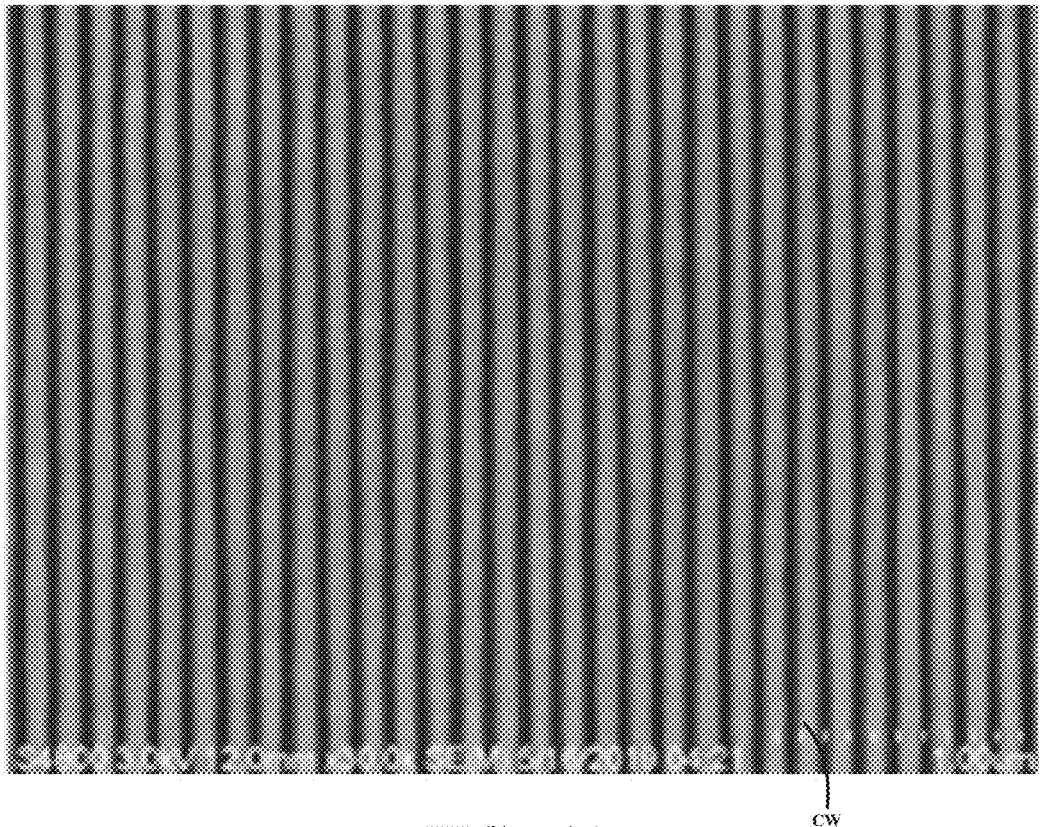
FIG. 11A is a scanning electron microscopy plan view image of a wire grid polarizer in some embodiments according to the present disclosure.
Figure 11B:
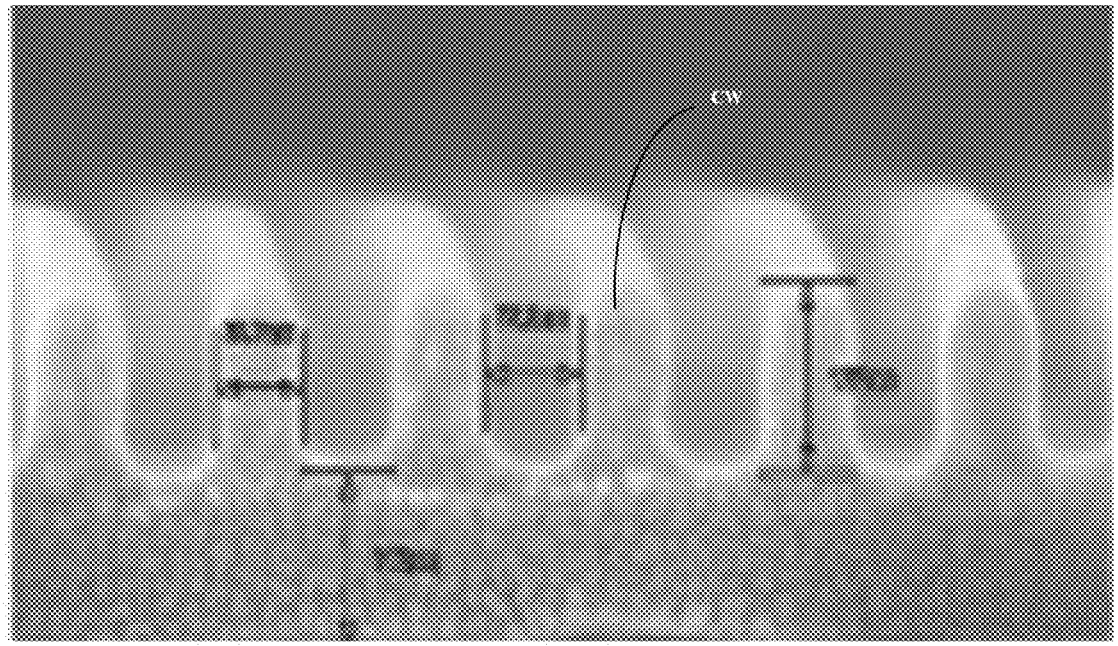
FIG. 11B is a scanning electron microscopy cross-sectional view image of a wire grid polarizer in some embodiments according to the present disclosure.

FIG. 11A is a scanning electron microscopy plan view image of a wire grid polarizer in some embodiments according to the present disclosure. FIG. 11B is a scanning electron microscopy cross-sectional view image of a wire grid polarizer in some embodiments according to the present disclosure. In some embodiments, the wire grid polarizer has a grating structure. The wire grid polarizer includes a regular array of parallel conductive wires CW, placed in a plane perpendicular to the incident light beam. Electromagnetic waves which have a component of their electric fields aligned parallel to the wires induce the movement of electrons along the length of the wires. Electric field components parallel to the wires are reflected, and electric field components which are perpendicular to the wires pass through the grid.

Figure 12:
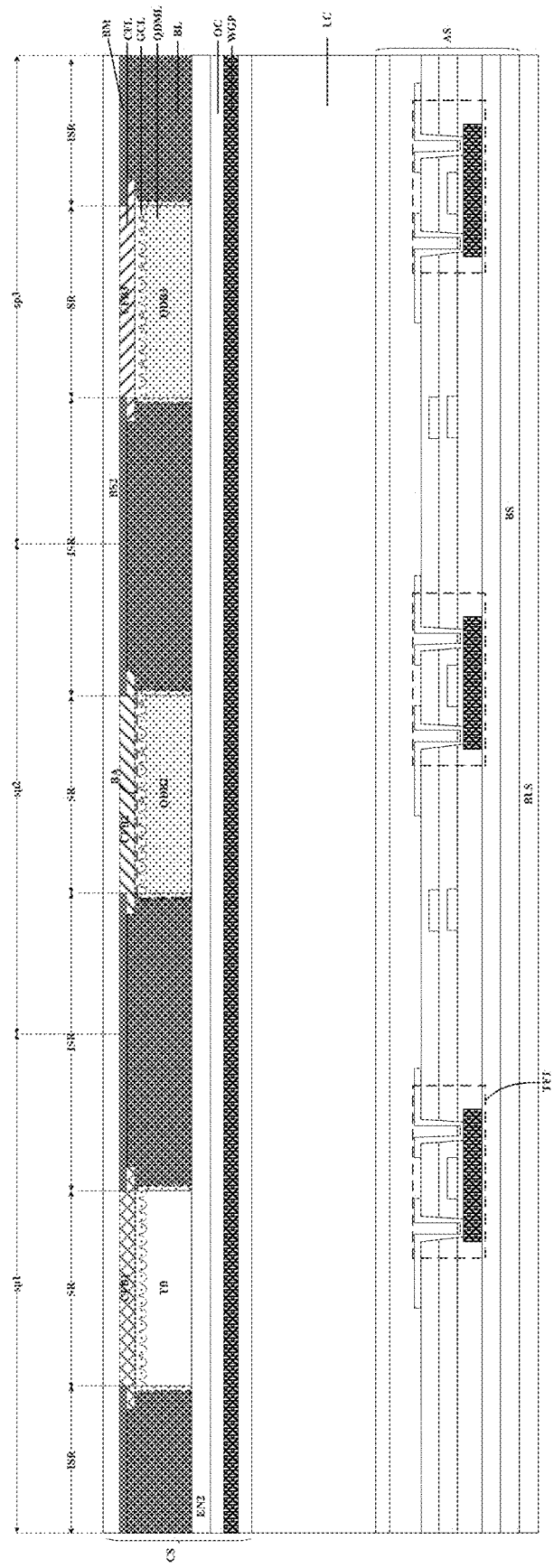
FIG. 12 is a schematic diagram illustrating the structure of a display panel in some embodiments according to the present disclosure.

In another aspect, the present disclosure provides a display panel. In some embodiments, the display panel includes the counter substrate described herein or fabricated by a method described herein, and an array substrate including a plurality of thin film transistors. Optionally, the display panel is a liquid crystal display panel, and the display panel further includes a liquid crystal layer between the counter substrate and the array substrate. FIG. 12 is a schematic diagram illustrating the structure of a display panel in some embodiments according to the present disclosure. Referring to FIG. 12, the display panel is a liquid crystal display panel including an array substrate AS, the counter substrate CS described herein or fabricated by a method described herein, a liquid crystal layer LC between the array substrate AS and the counter substrate CS, and a back light BL on a side of the array substrate away from the counter substrate CS. Optionally, the back light BL is configured to emit a light of a first color, e.g., a blue light. The array substrate AS includes a plurality of thin film transistors TFT.

In another aspect, the present disclosure further provides a method of fabricating a counter substrate. In some embodiments, the method includes forming a bank layer on a second base substrate, the bank layer formed to define a plurality of bank apertures; forming a barrier coating layer in a respective one of the plurality of bank apertures; forming a quantum dots material layer on the second base substrate, forming the quantum dots material layer including forming a plurality of quantum dots blocks respectively in at least some of the plurality of bank apertures; and forming an overcoat layer on a side of the quantum dots material layer, the bank layer, and the barrier coating layer away from the second base substrate. Optionally, the barrier coating layer is in direct contact with a respective one of the plurality of quantum dots blocks.

In some embodiments, the bank layer is formed so that at least a portion of the bank layer between two adjacent bank apertures includes a first surface in contact with the overcoat layer, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures; at least a portion of the third surface is a wavy surface comprising alternating convex and concave portions; and at least a portion of the fourth surface is a wavy surface comprising alternating convex and concave portions.

In some embodiments, forming the bank layer includes forming a photoresist layer on the base substrate; exposing the photoresist layer with a light under a condition to induce standing wave effect on exposing the photoresist layer; and developing an exposed photoresist layer to form the bank layer having wavy surfaces as a result of the standing wave effect. In some embodiments, the light beam for exposing the photoresist layer is under a condition so that the light beam transmits through air, the base substrate, various layers on the base substrate. The light beam is reflected at various interfaces among the air, the base substrate, and the various layers on the base substrate, resulting in constructive interference and destructive interference so as to form a standing wave effect in the photoresist layer. After the exposure and development, a profile of the photoresist layer has an undulated pattern. Optionally, the profile has a saw-toothed pattern.

In some embodiments, the method further includes forming a barrier coating layer in a respective one of the plurality of bank apertures. Optionally, forming the quantum dots material layer includes ink-jet printing a quantum dots material solution into the respective one of the plurality of bank apertures, and drying the quantum dots material solution. Optionally, a respective one of the plurality of quantum dots blocks is formed to be in direct contact with the barrier coating layer.

In some embodiments, forming the barrier coating layer includes depositing a graphene material layer in the respective one of the plurality of bank apertures; and performing a surface plasma treatment on the graphene material layer to form surface functionalized graphene on a surface of the graphene material layer. Optionally, the surface functionalized graphene comprises one or more of surface functional groups selected from a group consisting of a hydroxyl group (—OH), a carboxyl group (—COOH), an amine group (—NH2), a sulfhydryl group (—SH), a nitrile group (—CN), a sulfinic group (—SOOH), a secondary amide group (—CONH—), a secondary amine group (—NH—), a sulfonic acid group (—SO3H), and a primary amide group (—CONH2).

In some embodiments, the method further includes forming a wire grid polarizer on a side of the overcoat layer away from the second base substrate. Optionally, forming the wire grid polarizer includes depositing a conductive material layer on the overcoat layer; patterning the conductive material layer to form a plurality of conductive wires parallel to each other.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:
   a base substrate;
   a bank layer on the base substrate, the bank layer defining a plurality of bank apertures;
   a quantum dots material layer on the base substrate, the quantum dots material layer comprising a plurality of quantum dots blocks respectively in at least some of the plurality of bank apertures; and
   a barrier coating layer in a respective one of the plurality of bank apertures;
   wherein at least a portion of the bank layer between two adjacent bank apertures comprises a first surface, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures;
   at least a portion of the third surface is a wavy surface comprising alternating convex and concave portions;
   at least a portion of the fourth surface is a wavy surface comprising alternating convex and concave portions;
   in a respective one of the plurality of bank apertures having a respective one of the plurality of quantum dots blocks, an orthographic projection of the alternating convex and concave portions of the third surface on a vertical plane at least partially overlaps with an orthographic projection of the respective one of the plurality of quantum dots blocks on the vertical plane, and an orthographic projection of the alternating convex and concave portions of the fourth surface on the vertical plane at least partially overlaps with an orthographic projection of the respective one of the plurality of quantum dots blocks on the vertical plane; and
   the vertical plane is a plane perpendicular to the base substrate and perpendicular to a direction from the first bank aperture to the second bank aperture;
   wherein the barrier coating layer is in direct contact with the at least a portion of the third surface and in direct contact with the at least a portion of the fourth surface;
   the barrier coating layer comprises surface functionalized graphene; and
   the surface functionalized graphene is a plasma functionalized graphene comprising one or more of surface functional groups, which bind, through interactions comprising hydrogen bonds, to functional groups in quantum dots materials in the respective one of the plurality of quantum dots blocks.

2. The display panel of claim 1, wherein the barrier coating layer is in direct contact with the respective one of the plurality of quantum dots blocks.

3. The display panel of claim 1, wherein a portion of the barrier coating layer in direct contact with the at least a portion of the third surface has a wavy surface comprising alternating convex and concave portions; and
a portion of the barrier coating layer in direct contact with the at least a portion of the fourth surface has a wavy surface comprising alternating convex and concave portions.

4. The display panel of claim 1, further comprising a color filter layer on a side of the quantum dots material layer away from the base substrate;
wherein the color filter layer comprises a plurality of color filter blocks respectively on a side of the plurality of bank apertures away from the base substrate.

5. The display panel of claim 1, further comprising:
a plurality of thin film transistors on the base substrate;
a planarization layer on a side of the plurality of thin film transistors away from the base substrate;
an anode layer comprising a plurality of anodes on a side of the planarization layer away from the base substrate;
a pixel definition layer on a side of the planarization layer and the anode layer away from the base substrate, the pixel definition layer defining a plurality of subpixel apertures;
a light emitting material layer on a side of the anode layer away from the base substrate, the light emitting material layer comprising a plurality of light emitting blocks respectively in the plurality of subpixel apertures;
a cathode layer on a side of the light emitting material layer away from the base substrate;
an encapsulating layer on a side of the cathode layer away from the base substrate;
wherein the bank layer and the pixel definition layer are in an inter-subpixel region of the display panel; and
an orthographic projection of the bank layer on the base substrate at least partially overlaps with an orthographic projection of the pixel definition layer on the base substrate.

6. The display panel of claim 5, further comprising a second base substrate opposite to the base substrate;
wherein the bank layer and the quantum dots material layer are between the second base substrate and the encapsulating layer;
the display panel further comprises:
a second encapsulating layer on a side of the bank layer and the quantum dots material layer away from the second base substrate, encapsulating the bank layer and the quantum dots material layer; and
a filler layer between the encapsulating layer and the second encapsulating layer.

7. The display panel of claim 1, wherein the display panel is a liquid crystal display panel comprising an array substrate, a counter substrate, a liquid crystal layer between the array substrate and the counter substrate, and a back light;
wherein the counter substrate comprises a second base substrate;
wherein the bank layer and the quantum dots material layer are on the second base substrate;
wherein the counter substrate further comprises:
a barrier coating layer in a respective one of the plurality of bank apertures; and
an overcoat layer on a side of the quantum dots material layer, the bank layer, and the barrier coating layer away from the second base substrate;
wherein the barrier coating layer is in direct contact with a respective one of the plurality of quantum dots blocks.

8. The display panel of claim 7, wherein the counter substrate further comprises a wire grid polarizer on a side of the overcoat layer away from the second base substrate.

9. A display apparatus, comprising the display panel of claim 1, and an integrated circuit connected to the display panel.

10. A display panel, comprising:
a base substrate;
a bank layer on the base substrate, the bank layer defining a plurality of bank apertures;
a quantum dots material layer on the base substrate, the quantum dots material layer comprising a plurality of quantum dots blocks respectively in at least some of the plurality of bank apertures;
a plurality of thin film transistors on the base substrate;
a planarization layer on a side of the plurality of thin film transistors away from the base substrate;
an anode layer comprising a plurality of anodes on a side of the planarization layer away from the base substrate;
a pixel definition layer on a side of the planarization layer and the anode layer away from the base substrate, the pixel definition layer defining a plurality of subpixel apertures;
a light emitting material layer on a side of the anode layer away from the base substrate, the light emitting material layer comprising a plurality of light emitting blocks respectively in the plurality of subpixel apertures;
a cathode layer on a side of the light emitting material layer away from the base substrate; and
an encapsulating layer on a side of the cathode layer away from the base substrate;
wherein at least a portion of the bank layer between two adjacent bank apertures comprises a first surface, a second surface opposite to the first surface, a third surface connecting the first surface and the second surface closer to a first bank aperture of the two adjacent bank apertures, and a fourth surface connecting the first surface and the second surface closer to a second bank aperture of the two adjacent bank apertures;
at least a portion of the third surface is a wavy surface comprising alternating convex and concave portions;
at least a portion of the fourth surface is a wavy surface comprising alternating convex and concave portions;
in a respective one of the plurality of bank apertures having a respective one of the plurality of quantum dots blocks, an orthographic projection of the alternating convex and concave portions of the third surface on a vertical plane at least partially overlaps with an orthographic projection of the respective one of the plurality of quantum dots blocks on the vertical plane, and an orthographic projection of the alternating convex and concave portions of the fourth surface on the vertical plane at least partially overlaps with an orthographic projection of the respective one of the plurality of quantum dots blocks on the vertical plane; and
the vertical plane is a plane perpendicular to the base substrate and perpendicular to a direction from the first bank aperture to the second bank aperture;
wherein the bank layer and the pixel definition layer are in an inter-subpixel region of the display panel; and an orthographic projection of the bank layer on the base substrate at least partially overlaps with an orthographic projection of the pixel definition layer on the base substrate;

wherein the first surface is in direct contact with the encapsulating layer; and in the respective one of the plurality of bank apertures, the respective one of the quantum dots blocks is on a side of a portion of the encapsulating layer away from the cathode layer;

wherein the display panel further comprises a barrier coating layer in a respective one of the plurality of bank apertures; and at least a portion of the barrier coating layer is in direct contact with the portion of the encapsulating layer.

* * * * *